US008632957B2

(12) United States Patent
Kawashima

(10) Patent No.: US 8,632,957 B2
(45) **Date of Patent: *Jan. 21, 2014**

(54) THERMALLY CROSSLINKABLE RESIN COMPOSITION FOR LASER ENGRAVING, RELIEF PRINTING PLATE PRECURSOR FOR LASER ENGRAVING AND PROCESS FOR PRODUCING SAME, AND RELIEF PRINTING PLATE AND PROCESS FOR MAKING SAME

(75) Inventor: Takashi Kawashima, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 257 days.

This patent is subject to a terminal disclaimer.

(21) Appl. No.: 12/978,185

(22) Filed: Dec. 23, 2010

(65) Prior Publication Data

US 2011/0159439 A1 Jun. 30, 2011

(30) Foreign Application Priority Data

Dec. 25, 2009 (JP) ................................ 2009-296127

(51) Int. Cl.
*G03C 1/00* (2006.01)
*G03F 7/00* (2006.01)

(52) U.S. Cl.
USPC ...................... 430/306; 430/270.1; 430/284.1

(58) Field of Classification Search
USPC ......................................................... 430/306
See application file for complete search history.

(56) References Cited

U.S. PATENT DOCUMENTS

| | | | | |
|---|---|---|---|---|
| 7,901,863 | B2 * | 3/2011 | Yamada et al. | 430/270.1 |
| 2004/0157162 | A1 * | 8/2004 | Yokota et al. | 430/306 |
| 2009/0246469 | A1 * | 10/2009 | Kawashima et al. | 428/156 |
| 2010/0075117 | A1 * | 3/2010 | Kawashima et al. | 428/195.1 |
| 2011/0076454 | A1 * | 3/2011 | Hitomi et al. | 428/156 |

FOREIGN PATENT DOCUMENTS

| | | | |
|---|---|---|---|
| JP | 11-338139 | A | 12/1999 |
| JP | 2004-174758 | A | 6/2004 |
| WO | 2005/070691 | A1 | 8/2005 |
| WO | WO 2005070691 | A1 * | 8/2005 |

* cited by examiner

*Primary Examiner* — Chanceity Robinson
(74) *Attorney, Agent, or Firm* — Sughrue Mion, PLLC

(57) ABSTRACT

A process for making a relief printing plate is provided that includes a layer formation step of forming a relief-forming layer from a resin composition that contains (Component A) a compound having a hydrolyzable silyl group and/or a silanol group, (Component B) a binder polymer, and (Component C) a peroxide, a crosslinking step of thermally crosslinking the relief-forming layer to thus obtain a relief printing plate precursor having a crosslinked relief-forming layer, and an engraving step of laser-engraving the relief printing plate precursor having a crosslinked relief-forming layer to thus form a relief layer.

14 Claims, No Drawings

THERMALLY CROSSLINKABLE RESIN COMPOSITION FOR LASER ENGRAVING, RELIEF PRINTING PLATE PRECURSOR FOR LASER ENGRAVING AND PROCESS FOR PRODUCING SAME, AND RELIEF PRINTING PLATE AND PROCESS FOR MAKING SAME

BACKGROUND OF THE INVENTION

1. Technical Field

The present invention relates to a thermally crosslinkable resin composition for laser engraving, a relief printing plate precursor for laser engraving and a process for producing same, and a relief printing plate and a process for making same.

2. Background Art

Conventionally, a hydrophobic laser engraving type printing plate employing natural rubber, synthetic rubber, a thermoplastic elastomer, etc. is used (ref. JP-A-11-338139, etc. (JP-A denotes a Japanese unexamined patent application publication)). As a technique for improving the rinsing properties of engraving residue generated by laser engraving, a technique in which porous inorganic fine particles are contained in a relief-forming layer, and liquid residue is adsorbed on these particles, thus improving removability has been proposed (ref. e.g. JP-A-2004-174758). Furthermore, it has been shown that an organic silicon compound contained in a laser-engravable photosensitive resin composition reduces the percentage residue remaining after engraving (making it difficult for residue to be attached), and engraving residue can easily be wiped away by a cloth impregnated with an organic solvent (ref. International Patent Application WO 2005-070691).

SUMMARY OF THE INVENTION

Problems to be Solved by the Invention

The method described in JP-A-2004-174758 has the problem that, due to particles being contained, an engraved shape (edge shape) is not satisfactory, and degradation of image quality is caused.

Furthermore, in the method described in International Patent Application WO 2005-070691, tacky residue is removed using an organic solvent, and it is difficult to remove tacky residue using an aqueous system, which is excellent in terms of environment suitability.

It is an object of the present invention to provide a thermally crosslinkable resin composition for laser engraving that can give a relief printing plate having excellent hardness and UV ink suitability and that has excellent rinsing properties for engraving residue generated when laser-engraving a printing plate and excellent engraving sensitivity in laser engraving, a relief printing plate precursor employing the thermally crosslinkable resin composition for laser engraving, a process for making a relief printing plate employing same, and a relief printing plate obtained thereby.

Means for Solving the Problems

The above-mentioned object of the present invention has been achieved by means described in <1>, <12> to <15>, and <17> below. They are described below together with <2> to <11>, <16>, <18>, and <19>, which are preferred embodiments.

<1> A thermally crosslinkable resin composition for laser engraving comprising (Component A) a compound having a hydrolyzable silyl group and/or a silanol group, (Component B) a binder polymer, and (Component C) a peroxide, <2> the thermally crosslinkable resin composition for laser engraving according to <1>, wherein Component A above is a compound having a total of two or more hydrolyzable silyl groups and silanol groups, <3> the thermally crosslinkable resin composition for laser engraving according to <1> or <2>, wherein the hydrolyzable silyl group is a residue in which at least one of an alkoxy group and a halogen atom is directly bonded to the Si atom, <4> the thermally crosslinkable resin composition for laser engraving according to any one of <1> to <3>, wherein Component A above is a compound further having in the molecule at least one type of group or bond selected from the group consisting of a sulfide group, an ester bond, a urethane bond, and an ether bond, <5> the thermally crosslinkable resin composition for laser engraving according to any one of <1> to <4>, wherein Component B above is an elastomer, <6> the thermally crosslinkable resin composition for laser engraving according to any one of <1> to <5>, wherein Component B above comprises at least one selected from the group consisting of natural rubber (NR), acrylonitrile butadiene rubber (NBR), isoprene rubber (IR), styrene butadiene rubber (SBR), butadiene rubber (BR), chloroprene rubber (CR), polystyrene-polybutadiene-polystyrene (SBS), polystyrene-polyisoprene-polystyrene (SIS), and hydrogenated products thereof, <7> the thermally crosslinkable resin composition for laser engraving according to any one of <1> to <6>, wherein Component C above comprises an organic peroxide, <8> the thermally crosslinkable resin composition for laser engraving according to any one of <1> to <7>, wherein Component C above comprises at least one organic peroxide selected from the group consisting of a dialkyl peroxide, a peroxyketal, and a peroxyester, <9> the thermally crosslinkable resin composition for laser engraving according to any one of <1> to <8>, wherein it further comprises (Component D) a polymerizable compound, <10> the thermally crosslinkable resin composition for laser engraving according to any one of <1> to <9>, wherein it further comprises (Component E) a fragrance, <11> the thermally crosslinkable resin composition for laser engraving according to any one of <1> to <10>, wherein it further comprises (Component F) a photothermal conversion agent that can absorb light having a wavelength of at least 700 nm but no greater than 1,300 nm, <12> a relief printing plate precursor for laser engraving, comprising a relief-forming layer formed from the thermally crosslinkable resin composition for laser engraving according to any one of <1> to <11>, <13> a relief printing plate precursor for laser engraving, comprising a crosslinked relief-forming layer formed by thermally crosslinking a relief-forming layer formed from the thermally crosslinkable resin composition for laser engraving according to any one of <1> to <11>, <14> a process for producing a relief printing plate precursor for laser engraving, comprising a layer formation step of forming a relief-forming layer from the thermally crosslinkable resin composition for laser engraving according to any one of <1> to <11>, and a crosslinking step of thermally crosslinking the relief-forming layer to thus obtain a relief printing plate precursor having a crosslinked relief-forming layer, <15> a process for making a relief printing plate, comprising a layer formation step of forming a relief-forming layer from the thermally crosslinkable resin composition for laser engraving according to any one of <1> to <11>, a crosslinking step of thermally crosslinking the relief-forming layer to thus obtain a relief printing plate precursor having a crosslinked relief-forming layer, and an engraving step of laser-engraving the relief printing plate precursor having a crosslinked relief-forming layer to thus form a relief layer, <16> the process for making a relief printing plate according to <15>, wherein it further comprises a rinsing step of rinsing an engraved relief layer surface with an aqueous rinsing liquid, <17> a relief printing plate comprising a relief layer produced by the process for making a relief printing plate according to <15> or <16>, <18> the relief printing plate according to <17>, wherein the relief layer has a thickness of at least 0.05 mm but no greater than 10 mm, and <19> the relief printing plate according to <17> or <18>, wherein the relief layer has a Shore A hardness of at least 50° but no greater than 90°.

Effects of the Invention

In accordance with the present invention, there can be provided a thermally crosslinkable resin composition for laser engraving that can give a relief printing plate having excellent hardness and UV ink suitability and that has excellent rinsing properties for engraving residue generated when laser-engraving a printing plate and excellent engraving sensitivity in laser engraving, a relief printing plate precursor employing the thermally crosslinkable resin composition for laser engraving, a process for making a relief printing plate employing same, and a relief printing plate obtained thereby.

MODE FOR CARRYING OUT THE INVENTION

The present invention is explained in detail below.

(Thermally Crosslinkable Resin Composition for Laser Engraving)

The thermally crosslinkable resin composition for laser engraving of the present invention (hereinafter, also simply called a ‘resin composition for laser engraving’ or ‘resin composition’) comprises (Component A) a compound having a hydrolyzable silyl group and/or a silanol group, (Component B) a binder polymer, and (Component C) a peroxide.

In the present invention, the notation ‘lower limit to upper limit’ expressing a numerical range means ‘at least the lower limit but no greater than the upper limit’, and the notation ‘upper limit to lower limit’ means ‘no greater than the upper limit but at least the lower limit’. That is, they are numerical ranges that include the upper limit and the lower limit.

Since the resin composition for laser engraving of the present invention has high engraving sensitivity when applied to laser engraving and excellent rinsing properties for engraving residue, the time taken for forming a relief layer and making a plate can be reduced. The resin composition of the present invention having such characteristics may be used without any particular limitation in a wide range of other applications in addition to a relief-forming layer of a relief printing plate precursor that is subjected to laser engraving. For example, it may be used not only in formation of a relief-forming layer of a printing plate precursor for which formation of a raised relief is carried out by laser engraving, which is described in detail later, but also in formation of another material form in which asperities or apertures are formed on the surface, for example, various types of printing plates or various types of moldings in which an image is formed by laser engraving, such as an intaglio plate, a stencil plate, or a stamp.

Among them, a preferred embodiment is use in formation of a relief-forming layer provided on an appropriate support.

In the present specification, when a relief printing plate precursor is explained, a layer that comprises the binder polymer (Component B), that serves as an image-forming layer subjected to laser engraving, that has a flat surface, and that is an uncrosslinked crosslinkable layer is called a relief-forming layer, a layer that is formed by crosslinking the relief-forming layer is called a crosslinked relief-forming layer, and a layer that has asperities formed on the surface by laser engraving the crosslinked relief-forming layer is called a relief layer.

Constituent components of the resin composition for laser engraving are explained below.

<(Component A) Compound Having Hydrolyzable Silyl Group and/or Silanol Group>

The ‘hydrolyzable silyl group’ of (Component A) a compound having a hydrolyzable silyl group and/or a silanol group (hereinafter, called ‘Component A’ as appropriate) used in the resin composition for laser engraving of the present invention is a silyl group that is hydrolyzable; examples of hydrolyzable groups include an alkoxy group, a mercapto group, a halogen atom, an amide group, an acetoxy group, an amino group, and an isopropenoxy group. A silyl group is hydrolyzed to become a silanol group, and a silanol group undergoes dehydration-condensation to form a siloxane bond. Such a hydrolyzable silyl group or silanol group is preferably one represented by Formula (1) below.

(1)

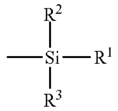

In Formula (1) above, at least one of $R^1$ to $R^3$ denotes a hydrolyzable group selected from the group consisting of an alkoxy group, a mercapto group, a halogen atom, an amide group, an acetoxy group, an amino group, and an isopropenoxy group, or a hydroxy group. The remainder of $R^1$ to $R^3$ independently denote a hydrogen atom, a halogen atom, or a monovalent organic substituent (examples including an alkyl group, an aryl group, an alkenyl group, an alkynyl group, and an aralkyl group).

In Formula (1) above, the hydrolyzable group bonded to the silicon atom is particularly preferably an alkoxy group or a halogen atom, and more preferably an alkoxy group.

From the viewpoint of rinsing properties and printing durability, the alkoxy group is preferably an alkoxy group having 1 to 30 carbon atoms, more preferably an alkoxy group having 1 to 15 carbon atoms, yet more preferably an alkoxy group having 1 to 5 carbon atoms, particularly preferably an alkoxy group having 1 to 3 carbon atoms, and most preferably a methoxy group or an ethoxy group.

Furthermore, examples of the halogen atom include an F atom, a Cl atom, a Br atom, and an I atom, and from the viewpoint of ease of synthesis and stability it is preferably a Cl atom or a Br atom, and more preferably a Cl atom.

Component A in the present invention is preferably a compound having one or more groups represented by Formula (1) above, and more preferably a compound having two or more. A compound having two or more hydrolyzable silyl groups is particularly preferably used. That is, a compound having in the molecule two or more silicon atoms having a hydrolyzable group bonded thereto is preferably used. The number of silicon atoms having a hydrolyzable group bond thereto contained in Component A is preferably at least 2 but no greater than 6, and most preferably 2 or 3.

A range of 1 to 4 of the hydrolyzable groups may bond to one silicon atom, and the total number of hydrolyzable groups in Formula (1) is preferably in a range of 2 or 3. It is particularly preferable that three hydrolyzable groups are bonded to a silicon atom. When two or more hydrolyzable groups are bonded to a silicon atom, they may be identical to or different from each other.

Specific examples of an alkoxy group preferable as the hydrolyzable group include a methoxy group, an ethoxy group, a propoxy group, an isopropoxy group, a butoxy group, a tert-butoxy group, a phenoxy group, and a benzyloxy group. A plurality of each of these alkoxy groups may be used in combination, or a plurality of different alkoxy groups may be used in combination.

Examples of the alkoxysilyl group having an alkoxy group bonded thereto include a trialkoxysilyl group such as a trimethoxysilyl group, a triethoxysilyl group, a triisopropoxysilyl group, or a triphenoxysilyl group; a dialkoxymonoalkylsilyl group such as a dimethoxymethylsilyl group or a diethoxymethylsilyl group; and a monoalkoxydialkylsilyl group such as a methoxydimethylsilyl group or an ethoxydimethylsilyl group.

Component A preferably has in the molecule at least a sulfide group, an ester bond, a urethane bond, an ether bond, a urea bond, or an imino group.

Among them, from the viewpoint of removability (rinsing properties) of engraving residue, Component A preferably further comprises at least one type of group or bond selected from the group consisting of a sulfide group, an ester bond, a urethane bond, and an ether bond (in particular, an ether bond contained in an oxyalkylene group), which are easily decomposed by aqueous alkali. Component A may have one type of such a group or bond or may have a plurality of types thereof. Furthermore, it may have a plurality of bonds such as, for example, two ester bonds.

In addition, in the present invention, the sulfide group includes a disulfide group (—S—S—), a trisulfide (—S—S—S—), a tetrasulfide group (—S—S—S—S—), etc.

Furthermore, Component A in the present invention is preferably a compound that does not have an ethylenically unsaturated bond.

As Component A in the present invention, there can be cited a compound in which a plurality of groups represented by Formula (1) above are bonded via a divalent linking group, and from the viewpoint of the effect, such a divalent linking group is preferably a linking group having a sulfide group (—S—), an imino group (—N(R)—) or a urethane bond (—OCON(R)— or —N(R)COO—). R denotes a hydrogen atom or a substituent. Examples of the substituent denoted by R include an alkyl group, an aryl group, an alkenyl group, an alkynyl group, and an aralkyl group.

A method for synthesizing Component A is not particularly limited, and synthesis can be carried out by a known method. As one example, a representative synthetic method for a Component A containing a linking group having the above-mentioned specific structure is shown below.

<Synthetic Method for Compound Having Sulfide Group as Linking Group and Having Hydrolyzable Silyl Group and/or Silanol Group>

A synthetic method for a Component A having a sulfide group as a linking group (hereinafter, called as appropriate a 'sulfide linking group-containing Component A') is not particularly limited, but specific examples thereof include reaction of a Component A having a halogenated hydrocarbon group with an alkali metal sulfide, reaction of a Component A having a mercapto group with a halogenated hydrocarbon, reaction of a Component A having a mercapto group with a Component A having a halogenated hydrocarbon group, reaction of a Component A having a halogenated hydrocarbon group with a mercaptan, reaction of a Component A having an ethylenically unsaturated double bond with a mercaptan, reaction of a Component A having an ethylenically unsaturated double bond with a Component A having a mercapto group, reaction of a compound having an ethylenically unsaturated double bond with a Component A having a mercapto group, reaction of a ketone with a Component A having a mercapto group, reaction of a diazonium salt with a Component A having a mercapto group, reaction of a Component A having a mercapto group with an oxirane, reaction of a Component A having a mercapto group with a Component A having an oxirane group, reaction of a mercaptan with a Component A having an oxirane group, and reaction of a Component A having a mercapto group with an aziridine.

<Synthetic Method for Compound Having Imino Group as Linking Group and Having Hydrolyzable Silyl Group and/or Silanol Group>

A synthetic method for a Component A having an imino group as a linking group (hereinafter, called as appropriate an 'imino linking group-containing Component A') is not particularly limited, but specific examples include reaction of a Component A having an amino group with a halogenated hydrocarbon, reaction of a Component A having an amino group with a Component A having a halogenated hydrocarbon group, reaction of a Component A having a halogenated hydrocarbon group with an amine, reaction of a Component A having an amino group with an oxirane, reaction of a Component A having an amino group with a Component A having an oxirane group, reaction of an amine with a Component A having an oxirane group, reaction of a Component A having an amino group with an aziridine, reaction of a Component A having an ethylenically unsaturated double bond with an amine, reaction of a Component A having an ethylenically unsaturated double bond with a Component A having an amino group, reaction of a compound having an ethylenically unsaturated double bond with a Component A having an amino group, reaction of a compound having an acetylenically unsaturated triple bond with a Component A having an amino group, reaction of a Component A having an imine-based unsaturated double bond with an organic alkali metal compound, reaction of a Component A having an imine-based unsaturated double bond with an organic alkaline earth metal compound, and reaction of a carbonyl compound with a Component A having an amino group.

<Synthetic Method for Compound Having Urethane Bond (Ureylene Group) as Linking Group and Having Hydrolyzable Silyl Group and/or Silanol Group>

A synthetic method for Component A having an ureylene group (hereinafter, called as appropriate a 'ureylene linking group-containing Component A') as a linking group is not particularly limited, but specific examples include synthetic methods such as reaction of a Component A having an amino group with an isocyanate ester, reaction of a Component A having an amino group with a Component A having an isocyanate ester, and reaction of an amine with a Component A having an isocyanate ester.

Component A is preferably a compound represented by Formula (A-1) or Formula (A-2) below.

(A-1)

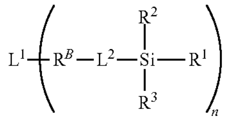

(A-2)

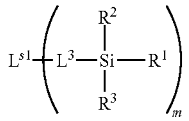

(In Formula (A-1) and Formula (A-2), $R^B$ denotes an ester bond, an amide bond, a urethane bond, a urea bond, or an imino group, $L^1$ denotes an n-valent linking group, $L^2$ denotes a divalent linking group, $L^{s1}$ denotes an m-valent linking group, $L^3$ denotes a divalent linking group, n and m independently denote an integer of 1 or greater, and $R^1$ to $R^3$ independently denote a hydrogen atom, a halogen atom, or a monovalent organic substituent. In addition, at least one of $R^1$ to $R^3$ denotes a hydrolyzable group selected from the group consisting of an alkoxy group, a mercapto group, a halogen atom, an amide group, an acetoxy group, an amino group, and an isopropenoxy group, or a hydroxy group.)

$R^1$ to $R^3$ in Formula (A-1) and Formula (A-2) above have the same meanings as those of $R^1$ to $R^3$ in Formula (1) above, and preferred ranges are also the same.

From the viewpoint of rinsing properties and film strength, $R^B$ above is preferably an ester bond or a urethane bond, and is more preferably an ester bond.

The divalent or n-valent linking group denoted by $L^1$ to $L^3$ above is preferably a group formed from at least one type of atom selected from the group consisting of a carbon atom, a hydrogen atom, an oxygen atom, a nitrogen atom, and a sulfur atom, and is more preferably a group formed from at least one type of atom selected from the group consisting of a carbon atom, a hydrogen atom, an oxygen atom, and a sulfur atom. The number of carbon atoms of $L^1$ to $L^3$ above is preferably 2 to 60, and more preferably 2 to 30.

The m-valent linking group denoted by $L^{s1}$ above is preferably a group formed from a sulfur atom and at least one type of atom selected from the group consisting of a carbon atom, a hydrogen atom, an oxygen atom, a nitrogen atom, and a sulfur atom, and is more preferably an alkylene group or a group formed by combining two or more from an alkylene group, a sulfide group, and an imino group. The number of carbon atoms of $L^{s1}$ above is preferably 2 to 60, and more preferably 6 to 30.

n and m above are independently integers of 1 to 10, more preferably integers of 2 to 10, yet more preferably integers of 2 to 6, and particularly preferably 2.

From the viewpoint of removability (rinsing properties) of engraving residue, the n-valent linking group denoted by $L^1$ and/or the divalent linking group denoted by $L^2$, or the divalent linking group denoted by $L^3$ preferably has an ether bond, and more preferably has an ether bond contained in an oxyalkylene group.

Furthermore, $L^{s1}$ and $L^3$ above preferably do not have an ester bond, an amide bond, a urethane bond, a urea bond, or an imino group.

Among compounds represented by Formula (A-1) or Formula (A-2), from the viewpoint of crosslinkability, etc., the n-valent linking group denoted by $L^1$ and/or the divalent linking group denoted by $L^2$ in Formula (A-1) are preferably groups having a sulfur atom (preferably a sulfide group).

Specific examples of Component A that can be applied to the present invention are shown below. Examples thereof include vinyltrichlorosilane, vinyltrimethoxysilane, vinyltriethoxysilane, β-(3,4-epoxycyclohexyl)ethyltrimethoxysilane, γ-glycidoxypropyltrimethoxysilane, γ-glycidoxypropylmethyldiethoxysilane, γ-glycidoxypropyltriethoxysilane, γ-methacryloxypropylmethyldimethoxysilane, p-styryltrimethoxysilane, γ-methacryloxypropyltrimethoxysilane, γ-methacryloxypropylmethyldiethoxysilane, γ-methacryloxypropyltriethoxysilane, γ-acryloxypropyltrimethoxysilane, N-(β-aminoethyl)-γ-aminopropylmethyldimethoxysilane, N-(β-aminoethyl)-γ-aminopropyltrimethoxysilane, N-(β-aminoethyl)-γ-aminopropyltriethoxysilane, γ-aminopropyltrimethoxysilane, γ-aminopropyltriethoxysilane, N-phenyl-γ-aminopropyltrimethoxysilane, γ-mercaptopropyltrimethoxysilane, γ-mercaptopropyltriethoxysilane, mercaptomethyltrimethoxysilane, dimethoxy-3-mercaptopropylmethylsilane, 2-(2-aminoethylthioethyl)diethoxymethylsilane, 3-(2-acetoxyethylthiopropyl)dimethoxymethylsilane, 2-(2-aminoethylthioethyl)triethoxysilane, dimethoxymethyl-3-(3-phenoxypropylthiopropyl)silane, bis(triethoxysilylpropyl)disulfide, bis(triethoxysilylpropyl)tetrasulfide, 1,4-bis(triethoxysilyl)benzene, bis(triethoxysilyl)ethane, 1,6-bis(trimethoxysilyl)hexane, 1,8-bis(triethoxysilyl)octane, 1,2-bis(trimethoxysilyl)decane, bis(triethoxysilylpropyl)amine, bis(trimethoxysilylpropyl)urea, γ-chloropropyltrimethoxysilane, γ-ureidopropyltriethoxysilane, trimethylsilanol, diphenylsilanediol, and triphenylsilanol. Other than the above, the compounds shown below can be cited as preferred examples, but the present invention should not be construed as being limited thereto.

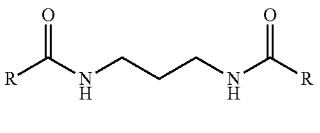

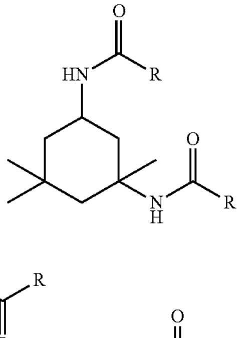

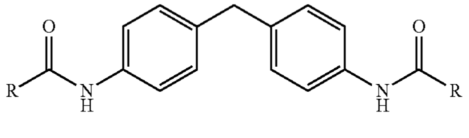

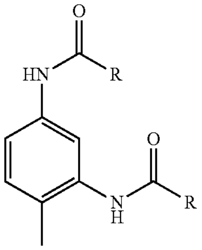

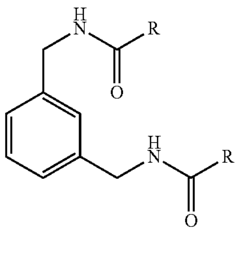

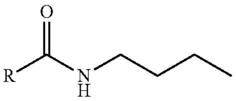

-continued
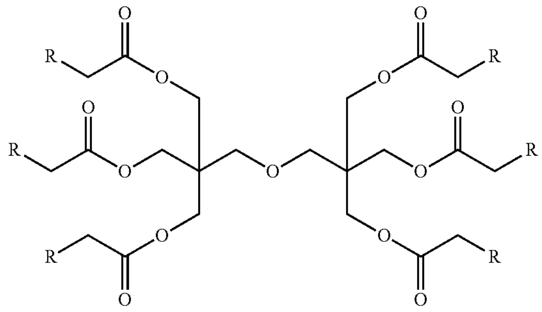
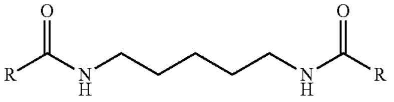
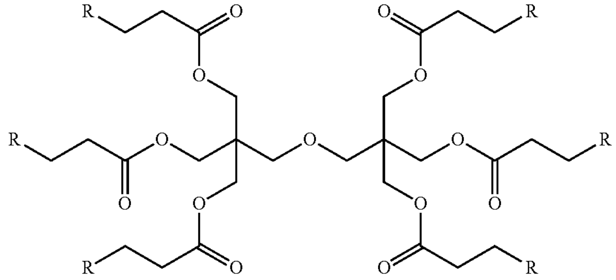
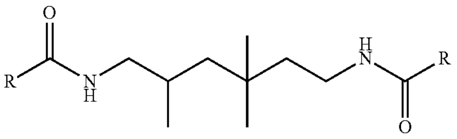
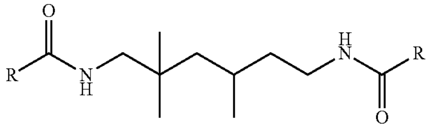
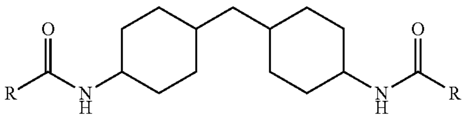
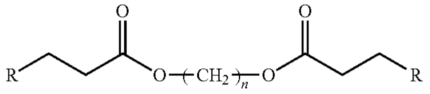
n = 2 ~ 20
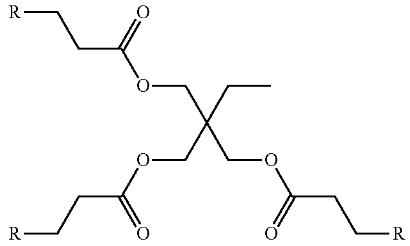
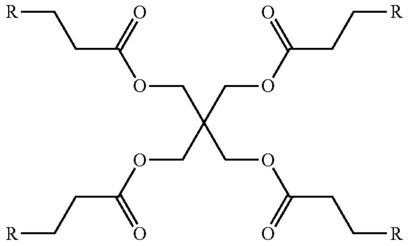
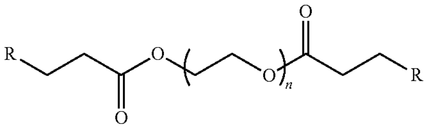
n = 1 ~ 50
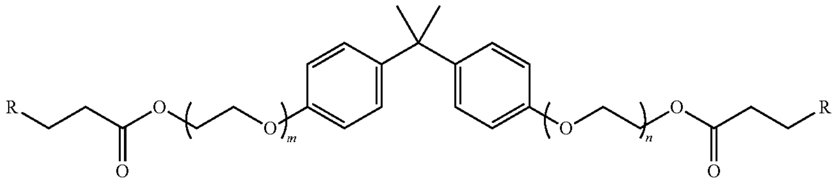
m + n = 2 ~ 50
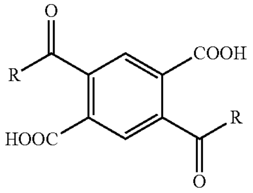
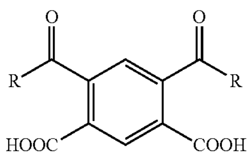
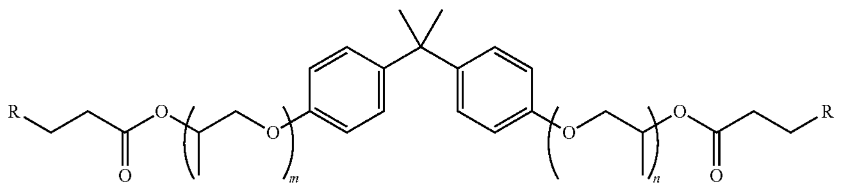
m + n = 2 ~ 50

-continued

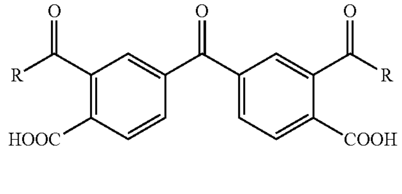
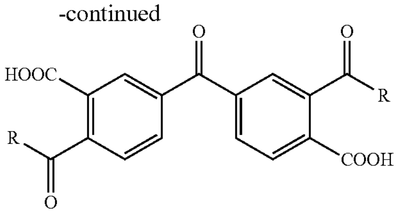
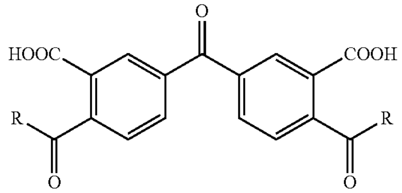
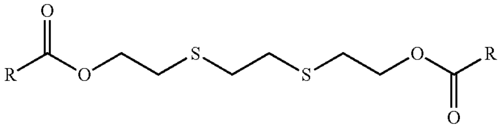
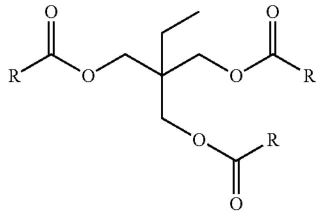
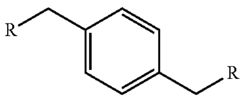
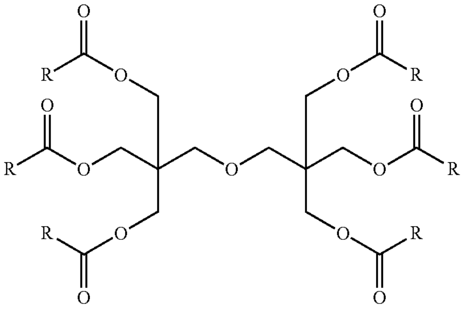
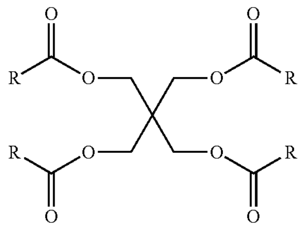
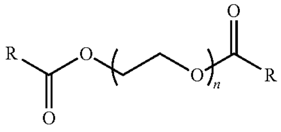

n = 1 ~ 50

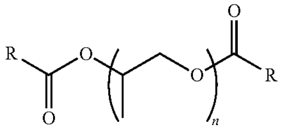

n = 1 ~ 50

In each of the formulae above, R denotes a partial structure selected from the structures below. When a plurality of Rs and $R^1$s are present in the molecule, they may be identical to or different from each other, and are preferably identical to each other in terms of synthetic suitability.

R: 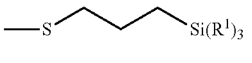 or

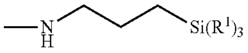 $R^1$: $—OCH_3$, $—OCH_2CH_3$,

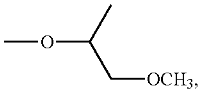 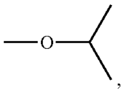 ,

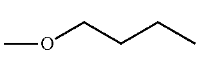 or 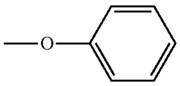

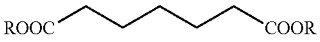

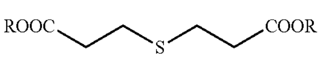 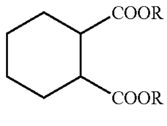

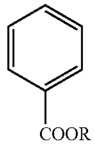 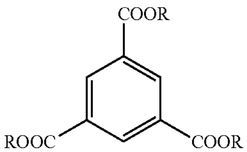

-continued

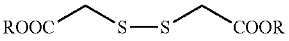 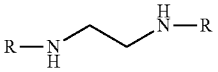

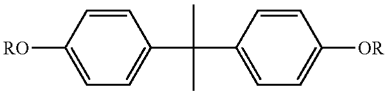

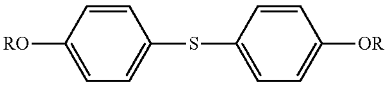

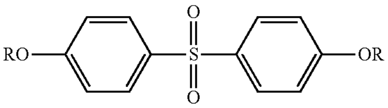

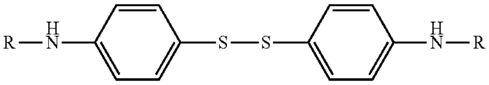

In each of the formulae above, R denotes a partial structure shown below. $R^1$ is the same as defined above. When a plurality of Rs and $R^1$s are present in the molecule, they may be identical to or different from each other, and in terms of synthetic suitability are preferably identical to each other.

R: 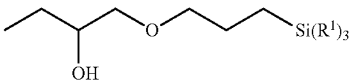

Component A may be obtained by synthesis as appropriate, but use of a commercially available product is preferable in terms of cost. Since Component A corresponds to for example commercially available silane products or silane coupling agents from Shin-Etsu Chemical Co., Ltd., Dow Corning Toray, Momentive Performance Materials Inc., Chisso Corporation, etc., the resin composition of the present invention may employ such a commercially available product by appropriate selection according to the intended application.

As Component A in the present invention, a partial hydrolysis-condensation product obtained using one type of compound having a hydrolyzable silyl group and/or a silanol group or a partial cohydrolysis-condensation product obtained using two or more types may be used. Hereinafter, these compounds may be called ‘partial (co)hydrolysis-condensation products’.

Among silane compounds as partial (co)hydrolysis-condensation product precursors, from the viewpoint of versatility, cost, and film compatibility, a silane compound having a substituent selected from a methyl group and a phenyl group as a substituent on the silicon is preferable, and specific preferred examples of the precursor include methyltrimethoxysilane, methyltriethoxysilane, phenyltrimethoxysilane, phenyltriethoxysilane, dimethyldimethoxysilane, dimethyldiethoxysilane, diphenyldimethoxysilane, and diphenyldiethoxysilane.

In this case, as a partial (co)hydrolysis-condensation product, it is desirable to use a dimer (2 moles of silane compound is reacted with 1 mole of water to eliminate 2 moles of alcohol, thus giving a disiloxane unit) to 100-mer of the above-mentioned silane compound, preferably a dimer to 50-mer, and yet more preferably a dimer to 30-mer, and it is also possible to use a partial cohydrolysis-condensation product formed using two or more types of silane compounds as starting materials.

As such a partial (co)hydrolysis-condensation product, ones commercially available as silicone alkoxy oligomers may be used (e.g. those from Shin-Etsu Chemical Co., Ltd.) or ones that are produced in accordance with a standard method by reacting a hydrolyzable silane compound with less than an equivalent of hydrolytic water and then removing by-products such as alcohol and hydrochloric acid may be used. When the production employs, for example, an acyloxysilane or an alkoxysilane described above as a hydrolyzable silane compound starting material, which is a precursor, partial hydrolysis-condensation may be carried out using as a reaction catalyst an acid such as hydrochloric acid or sulfuric acid, an alkali metal or alkaline earth metal hydroxide such as sodium hydroxide or potassium hydroxide, or an alkaline organic material such as triethylamine, and when the production is carried out directly from a chlorosilane, water and alcohol may be reacted using hydrochloric acid by-product as a catalyst.

With regard to Component A in the resin composition of the present invention, only one type may be used or two or more types may be used in combination.

The content of Component A contained in the resin composition of the present invention is preferably in the range of 0.1 to 80 mass % on a solids content basis, more preferably in the range of 1 to 40 mass %, and most preferably in the range of 5 to 30 mass %.

<(Component B) Binder Polymer>

The resin composition of the present invention comprises (Component B) a binder polymer (hereinafter, called ‘Component B’ as appropriate).

Component B in the resin composition of the present invention is a polymer that can be crosslinked by a peroxide (Component C), which is described later. Component B is preferably a conjugated diene monomer unit-containing polymer or a hydrogenated product thereof. Examples of Component B include a polymer obtained by polymerization of a conjugated diene-based hydrocarbon, a copolymer obtained by polymerization of a conjugated diene-based hydrocarbon and a monoolefin-based unsaturated compound, and hydrogenated products thereof.

Specific examples of the conjugated diene-based hydrocarbon include 1,3-butadiene, isoprene, and chloroprene. These compounds may be used on their own or in a combination of two or more types.

Specific examples of the monoolefin-based unsaturated compound include styrene, o-methylstyrene, p-methylstyrene, acrylonitrile, vinyl chloride, vinylidene chloride, acrylamide, methacrylamide, vinyl acetate, an acrylate ester, a methacrylate ester, and acrylic acid.

The polymer obtained by polymerization of a conjugated diene-based hydrocarbon and the copolymer obtained by polymerization of a conjugated diene-based hydrocarbon and a monoolefin-based unsaturated compound are not particularly limited; specific examples include a butadiene polymer, an isoprene polymer, a chloroprene polymer, a styrene-butadiene copolymer, a styrene-isoprene polymer, a styrene-chloroprene copolymer, an acrylonitrile-butadiene copolymer, an acrylonitrile-isoprene copolymer, an acrylonitrile-chloroprene copolymer, an acrylate ester-isoprene copolymer, an acrylate ester-chloroprene copolymer, an acrylonitrile-butadiene-styrene copolymer, a styrene-isoprene-styrene block polymer, and a styrene-butadiene-styrene block polymer. These polymers may be emulsion-polymerized or solution-polymerized.

Among them, from the viewpoint of flexibility and rubber elasticity being exhibited, a polymer having a glass transition temperature (Tg) of no greater than 20° C. is preferable. A binder polymer having such a glass transition temperature is called an elastomer below. An ‘elastomer’ is academically defined as a polymer having a glass transition temperature of no greater than normal temperature (ref. ‘Kagaku Dai Jiten’ (Science Dictionary) $2^{nd}$ edition, Ed. by Foundation for Advancement of International Science, Published by Maruzen, p. 154).

Specifically, Component B preferably comprises at least one selected from the group consisting of natural rubber (NR), acrylonitrile butadiene rubber (NBR), isoprene rubber (IR), styrene butadiene rubber (SBR), butadiene rubber (BR), chloroprene rubber (CR), polystyrene-polybutadiene-polystyrene (SBS), polystyrene-polyisoprene-polystyrene (SIS), and hydrogenated products thereof, and Component B is more preferably selected from the above group. Among them, from the viewpoint of cost, natural rubber, styrene butadiene rubber, and butadiene rubber are preferable.

As the natural rubber used in the present invention, one that is formed by coagulating rubber sap with an acid, washing with water, and drying, the so-called raw rubber, can be cited. Furthermore, one that is concentrated as a latex to have a rubber content of 60% to 70% may also be used.

In addition, Component B is a polymer that can be crosslinked by (Component C) a peroxide, which is described later and, for example, polyisobutylene (butyl rubber, IIR) is not appropriate as Component B. This is because polyisobutylene has a polyisobutene skeleton and when it is subjected to peroxide crosslinking main chain scission occurs and crosslinking cannot be carried out. In general, when a polymer containing a quaternary carbon in its main chain is subjected to peroxide crosslinking, main chain scission occurs and crosslinking cannot be carried out. However, if a polymer containing a quaternary carbon in its main chain has a crosslinkable group in a side chain, peroxide crosslinking might be possible, and in this case this polymer is appropriate as Component B.

With regard to Component B in the resin composition of the present invention, only one type may be used or two or more types may be used in combination.

From the viewpoint of a balance between shape retention of a coated film and engraving sensitivity being well satisfied, the content of Component B in the resin composition of the present invention is preferably 2 to 95 mass % of the total solids content, and more preferably 50 to 80 mass %.

The weight-average molecular weight (on a polystyrene basis by gel permeation chromatography (GPC) measurement) of Component B in the present invention is preferably 5,000 to 500,000. When the weight-average molecular weight is at least 5,000, shape retention as a single resin is excellent, and when it is no greater than 500,000, it is easily dissolved in a solvent such as water and is convenient for preparation of a relief-forming layer. The weight-average molecular weight of the polymer is preferably 10,000 to 400,000, and particularly preferably 15,000 to 300,000.

<(Component C) Peroxide>

The resin composition of the present invention comprises (Component C) a peroxide (hereinafter, called ‘Component C’ as appropriate).

Component C above is a component that functions as a crosslinking agent, and crosslinks at least Component B (binder polymer). Specific examples of Component C include those generally known as crosslinking agents for elastomers. With regard to the peroxide, one type may be used on its own or two or more types may be used in combination.

The content of Component C in the resin composition of the present invention is preferably 0.1 to 20 parts by mass relative to 100 parts by mass of Component B, more preferably 0.1 to 10 parts by mass, and yet more preferably 0.3 to 6 parts by mass.

It is preferable for the content of peroxide (C) to be at least 0.1 parts by mass since sufficient crosslinking reactivity is obtained and the resulting relief printing plate precursor has a high crosslink density and good engraving precision. On the other hand, it is preferable for the content of peroxide (C) to be no greater than 20 parts by mass since crosslinking is easily controlled in a stable state and processing properties are good.

It is preferable for peroxide (C) to have a 10-hour half-life temperature of at least 60° C., more preferably at least 80° C., and yet more preferably at least 100° C. Furthermore, it is preferable for it to have a 10-hour half-life temperature of no greater than 220° C., more preferably no greater than 200° C., and yet more preferably no greater than 180° C.

It is preferable for the 10-hour half-life temperature to be in the above-mentioned range since the resin composition has excellent stability and sufficient crosslink density is obtained.

The 10-hour half-life temperature is measured as follows.

—Method for Determining 10-Hour Half-Life Temperature—

A 0.1 mol/L concentration solution of a peroxide is prepared using benzene as a solvent, and sealed in a nitrogen-flushed glass tube. This is immersed in a thermostatted bath set at a predetermined temperature, thus carrying out thermal decomposition. Since, in general, decomposition of an organic peroxide in dilute solution can be treated as an approximately first order reaction, when the amount of peroxide decomposed is x (mol/L), the decomposition rate constant is k (1/h), the time is t (h), and the initial peroxide concentration is a (mol/L), Formula (1) and Formula (2) below hold.

$$dx/dt=k(a-x) \quad (1)$$

$$\ln\{a/(a-x)\}=kt \quad (2)$$

Since the half-life is the time taken for the peroxide concentration to decrease to half of the initial value by decomposition, if the half-life is denoted by $t_{1/2}$ and x of Formula (2) is substituted by a/2, this gives Formula (3) below.

$$kt_{1/2}=\ln 2 \quad (3)$$

Therefore, the half-life ($t_{1/2}$) at a given temperature can be determined from Formula (3) by carrying out thermal decomposition at the given temperature, plotting the relationship between time (t) and $\ln\{a/(a-x)\}$, and determining k from the slope of the straight line thus obtained.

With regard to the decomposition rate constant k, when the frequency factor is A (1/h), the activation energy is E (J/mol), the gas constant is R (8.314 J/mol·K), and the absolute temperature is T (K), Formula (4) below holds.

$$\ln k=\ln A-\Delta E/RT \quad (4)$$

Eliminating k from Formula (3) and Formula (4) gives $$\ln(t_{1/2})=\Delta E/RT-\ln(A/2) \quad (5),$$

$t_{1/2}$ is calculated for several temperature points, the relationship between $\ln(t_{1/2})$ and 1/T is plotted, and the temperature at $t_{1/2}$=10 h (10 hours) is determined from the straight line thus obtained.

Peroxide (C) above is preferably an organic peroxide. The organic peroxide is preferably a dialkyl peroxide, a peroxyketal, a peroxyester, a diacyl peroxide, an alkyl hydroperoxide, a peroxydicarbonate, or a ketone peroxide, and more preferably an organic peroxide selected from the group consisting of a dialkyl peroxide, a peroxyketal, and a peroxyester.

Examples of the dialkyl peroxide include di-t-butyl peroxide, di-t-hexyl peroxide, t-butylcumyl peroxide, dicumyl peroxide, α,α'-bis(t-butylperoxy)diisopropylbenzene, 2,5-dimethyl-2,5-bis(t-butylperoxy)hexane, and 2,5-dimethyl-2,5-bis(t-butylperoxy)hexyne-3.

Examples of the peroxyketal include n-butyl 4,4-bis(t-butylperoxy)valerate, 2,2-bis(t-butylperoxy)butane, 1,1-bis(t-butylperoxy)cyclohexane, 1,1-bis(t-hexylperoxy)cyclohexane, 1,1-bis(t-butylperoxy)-3,3,5-trimethylcyclohexane, and 1,1-bis(t-hexylperoxy)-3,3,5-trimethylcyclohexane.

Examples of the peroxyester include α-cumyl peroxyneodecanoate, 1,1-dimethyl-3-hydroxybutyl peroxy-2-ethylhexanoate, t-amyl peroxybenzoate, t-butyl peroxybenzoate, and t-butyl peroxypivalate.

Furthermore, as the organic peroxide, a diacyl peroxide such as dibenzoyl peroxide, succinic acid peroxide, dilauroyl peroxide, or didecanoyl peroxide, an alkyl hydroperoxide such as 2,5-dihydroperoxy-2,5-dimethylhexane, cumene hydroperoxide, or t-butyl hydroperoxide, or a peroxydicarbonate such as di(n-propyl)peroxydicarbonate, di(sec-butyl) peroxydicarbonate, or di(2-ethylhexyl) peroxydicarbonate may also be used.

Organic peroxides are commercially available from, for example, NOF Corporation, Kayaku Akzo Corporation, etc.

Furthermore, as peroxide (C) an inorganic peroxide may be used, and specific examples thereof include calcium peroxide, magnesium peroxide, strontium peroxide, barium peroxide, lithium peroxide, sodium peroxide, potassium peroxide, zinc peroxide, silver peroxide, copper peroxide, iron peroxide, and lead peroxide. Among them, calcium peroxide, barium peroxide, sodium peroxide, and zinc peroxide are preferable, and calcium peroxide and zinc peroxide are particularly preferable.

Together with Component A, Component B, and Component C which are described above as essential components in the resin composition of the present invention, an optional component such as a polymerizable compound, a fragrance, or a photothermal conversion agent is preferably contained as necessary. Each of these components is explained in detail below.

<(Component D) Polymerizable Compound>

In the present invention, from the viewpoint of forming a crosslinked structure in a relief-forming layer, in order to form this structure it is preferable for the resin composition for laser engraving of the present invention to comprise (Componet D) a polymerizable compound (hereinafter, called 'Component D' as appropriate).

The polymerizable compound that can be used here may be selected freely from compounds having at least one ethylenically unsaturated bond, preferably at least two, more preferably two to six, and yet more preferably two. Furthermore, the polymerizable compound is a compound that is different from Component B and is preferably a compound having an ethylenically unsaturated bond at a molecular terminal. Moreover, the molecular weight (weight-average molecular weight) of the polymerizable compound is preferably less than 5,000.

The polymerizable compound is not particularly limited; known compounds may be used, and examples include those described in paragraphs 0098 to 0124 of JP-A-2009-204962 and JP-A-2009-255510.

A monofunctional monomer having one ethylenically unsaturated bond in the molecule and a polyfunctional monomer having two or more of said bonds in the molecule, which are used as the polymerizable compound, are explained below.

Since it is necessary to form a crosslinked structure in a relief-forming layer of the relief printing plate precursor for laser engraving of the present invention, a polyfunctional monomer is preferably used. The molecular weight of these polyfunctional monomers is preferably 120 to 3,000, and more preferably 200 to 2,000.

Examples of the monofunctional monomer and polyfunctional monomer include an ester of an unsaturated carboxylic acid (e.g. acrylic acid, methacrylic acid, itaconic acid, crotonic acid, isocrotonic acid, maleic acid, etc.) and a polyhydric alcohol compound and an amide of an unsaturated carboxylic acid and a polyvalent amine compound.

In accordance with the use of a polymerizable compound in the resin composition of the present invention, it is possible to adjust film physical properties such as brittleness and flexibility of a crosslinked relief-forming layer of a lithographic printing plate for laser engraving.

Furthermore, from the viewpoint of flexibility or brittleness of a crosslinked film, the content of Component D in the resin composition for laser engraving of the present invention is preferably 3 to 60 mass % on a solids content basis, and more preferably 5 to 30 mass %.

<(Component E) Fragrance>

In order to reduce odor, the resin composition for laser engraving of the present invention preferably comprises (Component E) a fragrance. A fragrance is effective in reducing odor when producing a relief printing plate precursor or when carrying out laser engraving.

When the resin composition for laser engraving of the present invention comprises (Component E) a fragrance, the odor of solvent evaporating when drying a liquid-form resin composition coated during production can be masked. Furthermore, unpleasant smell such as amine odor, ketone odor, aldehyde odor, or the foul burning smell of resin occurring when carrying out laser engraving can be masked.

Furthermore, since a fragrance is also effective in reducing the odor of sulfur, it is useful in the resin composition of the present invention comprising a sulfur atom-containing compound.

As the fragrance, a known fragrance may be used by appropriate selection; one type of fragrance may be used on its own, or a plurality of fragrances may be used in combination.

The fragrance is preferably selected as appropriate according to the silane compound, the vulcanizing agent, the polymer, etc. used in the resin composition, and it is preferable to carry out optimization by combining known fragrances. Examples of the fragrance include fragrances described in 'Gosei Koryo—Kagaku To Shohin Chishiki—(Synthetic Fragrances—Chemistry and Product Knowledge—)' (Motoichi Indo, The Chemical Daily Co., Ltd.), 'Koryo Kagaku Nyumon (Introduction to Fragrance Chemistry)' (Shoji Watanabe, Baifukan), 'Kaori no Hyakka' (Encyclopedia of Fragrances) (Ed. by Japan Perfumery & Flavoring Association, Asakura Publishing Co., Ltd.), and 'Koryo Kagaku Soran II (Complete Fragrance Chemistry II) Isolated Fragrances/Synthetic Fragrances/Applications of Fragrances' (Hirokawa-Shoten Ltd.).

Furthermore, examples of fragrances that can be used in the present invention include fragrances described in paragraphs 0012 to 0025 of JP-A-2009-203310.

Among them, it is preferable to use as the fragrance a terpene compound such as a terpene-based hydrocarbon, a terpene-based alcohol, a terpene oxide, a terpene-based aldehyde, a terpene-based ketone, a terpene-based carboxylic acid, a terpene-based lactone, or a terpene-based carboxylate ester and/or an ester compound such as an aliphatic ester, a furan-based carboxylate ester, an alicyclic carboxylate ester, a cyclohexylcarboxylate ester, or an aromatic carboxylate ester.

Furthermore, it is preferable to use a heat-resistant fragrance as the fragrance in the present invention. In accordance with the use of a heat-resistant fragrance, it is possible to mask bad odor due to decomposition of resin by releasing an aroma during laser engraving and, moreover, to give a (crosslinked) relief-forming layer and relief layer that can be stored for a long period of time while releasing hardly any aroma at normal temperature.

The heat-resistant fragrance referred to here means a fragrance that masks bad odor due to decomposition of resin, etc. by releasing an aroma during a laser engraving operation and that can be stored for a long period of time while releasing hardly any aroma at normal temperature.

As the heat-resistant fragrance, specifically, one or more types selected from the group consisting of the heliotrope-based, jasmine-based, rose-based, orange flower-based, amber-based, and musk-based fragrance components shown below are preferably used.

Furthermore, as a specific fragrance, there is a TABU type fragrance formed by superimposing, on an oriental base below containing patchouli oil as a main body, one selected from the group consisting of rose-based, amber-based, musk-based, and jasmine-based fragrance components below together with a dioctyl phthalate (DOP) solvent.

Oriental base: patchouli oil, Hercolyn (methyl abietate), vanillin, ethyl vanillin, coumarin Rose-based fragrance component: phenylethyl alcohol, geraniol, isobornyl methoxycyclohexanol Amber-based fragrance component: tetrahydroparamethylquinoline Musk-based fragrance component: galactoside, musk ketone Jasmine-based fragrance component: α-amylcinnamaldehyde, methyl dihydrojasmonate Moreover, an amethyst type fragrance having a heliotrope-based fragrance component below as a main fragrance note, a jasmine-based fragrance component and, furthermore, a rose-based fragrance component or an orange flower-based fragrance component in order to impart a top note and diffusibility together with a DOP solvent can be cited as a preferred example.

Heliotrope-based fragrance component: heliotropin, musk ketone, coumarin, ethyl vanillin, acetyl cedrene, Hercolyn (methyl abietate), eugenol, methyl ionone Rose-based fragrance component: damascone-β, damascone-α, iso-bornyl methoxycyclohexanol Orange flower-based fragrance component: methyl anthranilate, γ-undecalactone, γ-nonalactone Jasmine-based fragrance component: methyl dihydrojasmonate Furthermore, as another heat-resistant fragrance, a 6-hydroxyalkanoic acid or a 6-(5- and/or 6-alkenoyloxy)alkanoic acid may be preferably used.

The fragrance that can be used in the present invention preferably comprises at least a vanillin-based fragrance, a jasmine-based fragrance, or a mint-based fragrance, more preferably comprises a vanillin-based fragrance or a jasmine-based fragrance, and yet more preferably comprises a vanillin-based fragrance.

Furthermore, the fragrance in the resin composition of the present invention is preferably a vanillin-based fragrance, a jasmine-based fragrance, or a mint-based fragrance.

Specific preferred examples of the vanillin-based fragrance include vanillin, vanillic acid, vanillyl alcohol, vanillin propylene glycol acetal, methyl vanillin, ethyl vanillin, parahydroxybenzoic acid, and parahydroxybenzaldehyde.

Specific preferred examples of the jasmine-based fragrance include methyl dihydrojasmonate, methyl epi-dihydrojasmonate, methyl jasmonate, methyl epi-jasmonate, cis-jasmone, Jasmonan, cis-jasmone lactone, dihydrojasmone lactone, jasmine lactone, γ-jasmolactone, cis-jasmone lactone, methyl γ-decalactone, jasmolactone, γ-hexylactone, γ-octalactone, γ-nonalactone, 4-methyl-5-hexenolide-1:4, 2-n-hexylcyclopentanone, and alkyl cycloheptylmethylcarbonate.

Specific preferred examples of the mint-based fragrance include menthol, menthone, cineole, l-menthol, d-menthol, dl-menthol, d-neomenthol, d-isomenthol, peppermint oil, spearmint oil, and mint oil.

The content of the fragrance is preferably 0.003 to 1.5 mass % relative the total solids content of the resin composition, and more preferably 0.005 to 1.0 mass %. When in the above-mentioned range, a masking effect can be exhibited fully, the odor of the fragrance is appropriate, the operating environment can be improved, and engraving sensitivity is excellent.

<(Component F) Photothermal Conversion Agent>

The resin composition for laser engraving of the present invention preferably comprises a photothermal conversion agent.

It is surmised that the photothermal conversion agent absorbs laser light and generates heat thus promoting thermal decomposition of a cured material of the resin composition for laser engraving of the present invention. Because of this, it is preferable to select a photothermal conversion agent that absorbs light having the wavelength of the laser that is used for engraving.

When a laser (a YAG laser, a semiconductor laser, a fiber laser, a surface emitting laser, etc.) emitting infrared at a wavelength of 700 nm to 1,300 nm is used as a light source for laser engraving, it is preferable for the relief-forming layer in the present invention to comprise a photothermal conversion agent that can absorb light having a wavelength of 700 nm to 1,300 nm.

As the photothermal conversion agent in the present invention, various types of dye or pigment are used.

With regard to the photothermal conversion agent, examples of dyes that can be used include commercial dyes and known dyes described in publications such as 'Senryo Binran' (Dye Handbook) (Ed. by The Society of Synthetic Organic Chemistry, Japan, 1970). Specific examples include dyes having a maximum absorption wavelength at 700 nm to 1,300 nm, such as azo dyes, metal complex salt azo dyes, pyrazolone azo dyes, naphthoquinone dyes, anthraquinone dyes, phthalocyanine dyes, carbonium dyes, diimmonium compounds, quinone imine dyes, methine dyes, cyanine dyes, squarylium colorants, pyrylium salts, and metal thiolate complexes. In particular, cyanine-based colorants such as heptamethine cyanine colorants, oxonol-based colorants such as pentamethine oxonol colorants, and phthalocyanine-based colorants are preferably used. Examples include dyes described in paragraphs 0124 to 0137 of JP-A-2008-63554.

With regard to the photothermal conversion agent used in the present invention, examples of pigments include commercial pigments and pigments described in the Color Index (C.I.) Handbook, 'Saishin Ganryo Binran' (Latest Pigments Handbook) (Ed. by Nippon Ganryo Gijutsu Kyokai, 1977), 'Saisin Ganryo Ouyogijutsu' (Latest Applications of Pigment Technology) (CMC Publishing, 1986), 'Insatsu Inki Gijutsu' (Printing Ink Technology) (CMC Publishing, 1984). Examples include pigments described in paragraphs 0122 to 0125 in JP-A-2009-178869. Among these pigments, carbon black is preferable.

Any carbon black, regardless of classification by ASTM (American Society for Testing and Materials) and application (e.g. for coloring, for rubber, for dry cell, etc.), may be used as long as dispersibility, etc. in the composition is stable. Carbon black includes for example furnace black, thermal black, channel black, lamp black, and acetylene black. In order to make dispersion easy, a black colorant such as carbon black may be used as color chips or a color paste by dispersing it in nitrocellulose or a binder in advance using, as necessary, a dispersant, and such chips and paste are readily available as commercial products. Examples include carbon black include described in paragraphs 0130 to 0134 in JP-A-2009-178869.

The content of the photothermal conversion agent in the resin composition for laser engraving of the present invention largely depends on the size of the molecular extinction coefficient characteristic to the molecule, and is preferably 0.01 to 30 wt % relative to the total weight of the solids content of the resin composition, more preferably 0.05 to 20 wt %, and yet more preferably 0.1 to 10 wt %.

<(Component G) Polymerization Initiator>

When the resin composition for laser engraving of the present invention is used for preparing a relief-forming layer, it may further comprise (Component G) a polymerization initiator, and it is preferable to use this in combination with the polymerizable compound (Component D).

As the polymerization initiator, a radical polymerization initiator is preferable, and examples of the radical polymerization initiator include an aromatic ketone, an onium salt compound, a thio compound, a hexaarylbiimidazole compound, a ketoxime ester compound, a borate compound, an azinium compound, a metallocene compound, an active ester compound, a carbon-halogen bond-containing compound, and an azo-based compound.

Furthermore, a radical polymerization initiator is preferablly described in paragraphs 0074 to 0118 of JP-A-2008-63554.

In addition, in the present invention, since the peroxide (Component C) functions also as a radical polymerization initiator, polymerization of the polymerizable compound (Component D) proceeds without further adding a polymerization initiator.

With regard to the polymerization initiator (Component G) in the present invention, one type may be used on its own or two or more types may be used in combination.

The content of the polymerization initiator (Component G) in the resin composition for laser engraving of the present invention is preferably no greater than 10 mass % relative to the total solids content by mass of the relief-forming layer, more preferably no greater than 3 mass %, and yet more preferably none.

<Other Additives>

The resin composition for laser engraving of the present invention may comprise as appropriate various types of additives that are usually used in the rubber field as long as the effects of the present invention are not inhibited. Examples include a filler, a plasticizer, a wax, a metal oxide, an antiozonant, an anti-aging agent, a thermopolymerization inhibitor, and a colorant, and one type thereof may be used on its own or two more types may be used in combination.

(Relief Printing Plate Precursor for Laser Engraving)

A first embodiment of the relief printing plate precursor for laser engraving of the present invention comprises a relief-forming layer formed from the resin composition for laser engraving of the present invention.

A second embodiment of the relief printing plate precursor for laser engraving of the present invention comprises a crosslinked relief-forming layer formed by crosslinking a relief-forming layer formed from the resin composition for laser engraving of the present invention.

In the present invention, the 'relief printing plate precursor for laser engraving' means both or one of a precursor having a crosslinkable relief-forming layer formed from the resin composition for laser engraving in a state before being crosslinked and a precursor in a state in which the layer is cured by light or heat.

In the present invention, the 'relief-forming layer' means a layer in a state before being crosslinked, that is, a layer formed from the resin composition for laser engraving of the present invention, which may be dried as necessary.

In the present invention, the 'crosslinked relief-forming layer' means a layer formed by crosslinking the relief-forming layer. The crosslinking is carried out by means of heat. Furthermore, the crosslinking is not particularly limited as long as it is a reaction by which the resin composition is cured, and is a concept that includes a structure crosslinked due to a reaction between Components A, but it is preferable to form a crosslinked structure by a reaction at least between Component B (binder polymer) and Component C (peroxide), and a crosslinked structure may be formed by a reaction between Component A and Component B.

The 'relief printing plate' is prepared by laser engraving a printing plate precursor having a crosslinked relief-forming layer.

Moreover, in the present invention, the 'relief layer' means a layer of the relief printing plate formed by engraving using a laser, that is, the crosslinked relief-forming layer after laser engraving.

The relief printing plate precursor for laser engraving of the present invention has a relief-forming layer formed from a resin composition for laser engraving comprising the above-mentioned components. The (crosslinked) relief-forming layer is preferably provided above a support.

The relief printing plate precursor for laser engraving may further comprise, as necessary, an adhesive layer between the support and the (crosslinked) relief-forming layer and, above the (crosslinked) relief-forming layer, a slip coat layer and a protection film.

<Relief-Forming Layer>

The relief-forming layer is a layer formed from the resin composition for laser engraving of the present invention and is a thermally crosslinkable layer. With regard to the relief printing plate precursor for laser engraving of the present invention, it is preferable for it to further contain (Component D) a polymerizable compound in addition to a crosslinked structure formed from Component B and Component A and/or Component C since one having a relief-forming layer to which further crosslinkable functionality is imparted is obtained.

As a mode in which a relief printing plate is prepared using the relief printing plate precursor for laser engraving, a mode in which a relief printing plate is prepared by crosslinking a relief-forming layer to thus form a relief printing plate precursor having a crosslinked relief-forming layer, and the crosslinked relief-forming layer (hard relief-forming layer) is then laser-engraved to thus form a relief layer is preferable. By crosslinking the relief-forming layer, it is possible to prevent abrasion of the relief layer during printing, and it is possible to obtain a relief printing plate having a relief layer with a sharp shape after laser engraving.

The relief-forming layer may be formed by molding the resin composition for laser engraving that has the above-mentioned components for a relief-forming layer into a sheet shape or a sleeve shape. The relief-forming layer is usually provided above a support, which is described later, but it may be formed directly on the surface of a member such as a cylinder of equipment for plate making or printing or may be placed and immobilized thereon, and a support is not always required.

A case in which the relief-forming layer is mainly formed in a sheet shape is explained as an Example below.

<Support>

The support that can be used in the relief printing plate precursor for laser engraving is now explained.

A material used for the support of the relief printing plate precursor for laser engraving is not particularly limited, but one having high dimensional stability is preferably used, and examples thereof include metals such as steel, stainless steel, or aluminum, plastic resins such as a polyester (e.g. polyethylene terephthalate (PET), polybutylene terephthalate (PBT), or polyacrylonitrile (PAN)) or polyvinyl chloride, synthetic rubbers such as styrene-butadiene rubber, and glass fiber-reinforced plastic resins (epoxy resin, phenolic resin, etc.). As the support, a PET film or a steel substrate is preferably used. The configuration of the support depends on whether the relief-forming layer is in a sheet shape or a sleeve shape.

<Adhesive Layer>

An adhesive layer may be provided between the relief-forming layer and the support for the purpose of strengthening the adhesion between the two layers. Examples of materials (adhesives) that can be used in the adhesive layer include those described in 'Handbook of Adhesives', Second Edition, Ed by I. Skeist, (1977).

<Protection Film, Slip Coat Layer>

For the purpose of preventing scratches or dents in the relief-forming layer surface or the crosslinked relief-forming layer surface, a protection film may be provided on the relief-forming layer surface or the crosslinked relief-forming layer surface. The thickness of the protection film is preferably 25 to 500 μm, and more preferably 50 to 200 μm. The protection film may employ, for example, a polyester-based film such as PET or a polyolefin-based film such as PE (polyethylene) or PP (polypropylene). The surface of the film may be made matte. The protection film is preferably peelable.

When the protection film is not peelable or conversely has poor adhesion to the relief-forming layer, a slip coat layer may be provided between the two layers. The material used in the slip coat layer preferably employs as a main component a resin that is soluble or dispersible in water and has little tackiness, such as polyvinyl alcohol, polyvinyl acetate, partially saponified polyvinyl alcohol, a hydroxyalkylcellulose, an alkylcellulose, or a polyamide resin.

(Process for Producing Relief Printing Plate Precursor for Laser Engraving)

The process for producing a relief printing plate precursor for laser engraving is now explained.

Formation of a relief-forming layer in the relief printing plate precursor for laser engraving is not particularly limited, and examples thereof include a method in which the resin composition for laser engraving is prepared, solvent is removed from this coating solution composition for laser engraving, and it is melt-extruded onto a support. Alternatively, a method may be employed in which the coating solution composition for laser engraving is cast onto a support, and this is dried in an oven to thus remove solvent from the coating solution composition.

Among them, the process for producing a relief printing plate for laser engraving of the present invention is preferably a production process comprising a layer formation step of forming a relief-forming layer from the resin composition for laser engraving of the present invention and a crosslinking step of crosslinking the relief-forming layer by means of heat to thus obtain a relief printing plate precursor having a crosslinked relief-forming layer.

Subsequently, as necessary, a protection film may be laminated on the relief-forming layer. Laminating may be carried out by compression-bonding the protection film and the relief-forming layer by means of heated calendar rollers, etc. or putting a protection film into intimate contact with a relief-forming layer whose surface is impregnated with a small amount of solvent.

When a protection film is used, a method in which a relief-forming layer is first layered on a protection film and a support is then laminated may be employed.

When an adhesive layer is provided, it may be dealt with by use of a support coated with an adhesive layer. When a slip coat layer is provided, it may be dealt with by use of a protection film coated with a slip coat layer.

<Layer Formation Step>

The process for making a relief printing plate for laser engraving of the present invention preferably comprises a layer formation step of forming a relief-forming layer from the resin composition for laser engraving of the present invention.

Preferred examples of a method for forming the relief-forming layer include a method in which the resin composition for laser engraving of the present invention is prepared, solvent is removed as necessary from this resin composition for laser engraving, and it is then melt-extruded onto a support and a method in which the resin composition for laser engraving of the present invention is prepared, the resin composition for laser engraving of the present invention is cast onto a support, and this is dried in an oven to thus remove solvent.

The resin composition for laser engraving may be produced by, for example, dissolving Component A, Component B, Component C, and as optional components a fragrance, a photothermal conversion agent, a plasticizer, etc. in an appropriate solvent, and then dissolving a polymerizable compound and a polymerization initiator. Since it is necessary to remove most of the solvent component in a stage of producing a relief printing plate precursor, it is preferable to use as the solvent a volatile low-molecular-weight alcohol (e.g. methanol, ethanol, n-propanol, isopropanol, propylene glycol monomethyl ether), toluene, etc., and adjust the temperature, etc. to thus reduce as much as possible the total amount of solvent to be added.

The thickness of the relief-forming layer in the relief printing plate precursor for laser engraving before and after crosslinking is preferably at least 0.05 mm but no greater than 10 mm, more preferably at least 0.05 mm but no greater than 7 mm, and yet more preferably at least 0.05 mm but no greater than 3 mm.

<Crosslinking Step>

The process for making a relief printing plate for laser engraving of the present invention is preferably a production process that comprises a crosslinking step of thermally crosslinking the relief-forming layer to thus obtain a relief printing plate precursor having a crosslinked relief-forming layer.

The relief-forming layer may be crosslinked by heating the relief printing plate precursor for laser engraving (step of crosslinking by means of heat). As heating means for carrying out crosslinking by heat, there can be cited a method in which a printing plate precursor is heated in a hot air oven or a far-infrared oven for a predetermined period of time and a method in which it is put into contact with a heated roller for a predetermined period of time.

Due to the relief-forming layer being thermally crosslinked, firstly, a relief formed after laser engraving becomes sharp and, secondly, tackiness of engraving residue formed during laser engraving is suppressed.

(Relief Printing Plate and Process for Making Same)

The process for making a relief printing plate of the present invention preferably comprises a layer formation step of forming a relief-forming layer from the resin composition for laser engraving of the present invention, a crosslinking step of crosslinking the relief-forming layer by means of heat to thus obtain a relief printing plate precursor having a crosslinked relief-forming layer, and an engraving step of laser-engraving the relief printing plate precursor having the crosslinked relief-forming layer.

The relief printing plate of the present invention is a relief printing plate having a relief layer obtained by crosslinking and laser-engraving a layer formed from the resin composition for laser engraving of the present invention, and is preferably a relief printing plate made by the process for making a relief printing plate of the present invention.

The relief printing plate of the present invention may suitably employ a UV ink and an aqueous ink when printing.

The layer formation step and the crosslinking step in the process for making a relief printing plate of the present invention mean the same as the layer formation step and the crosslinking step in the above-mentioned process for producing a relief printing plate precursor for laser engraving, and preferred ranges are also the same.

<Engraving Step>

The process for producing a relief printing plate of the present invention preferably comprises an engraving step of laser-engraving the relief printing plate precursor having a crosslinked relief-forming layer.

The engraving step is a step of laser-engraving a crosslinked relief-forming layer that has been crosslinked in the crosslinking step to thus form a relief layer. Specifically, it is preferable to engrave a crosslinked relief-forming layer that has been crosslinked by irradiation with laser light according to a desired image, thus forming a relief layer. Furthermore, a step in which a crosslinked relief-forming layer is subjected to scanning irradiation by controlling a laser head using a computer in accordance with digital data of a desired image can preferably be cited.

This engraving step preferably employs an infrared laser. When irradiated with an infrared laser, molecules in the crosslinked relief-forming layer undergo molecular vibration, thus generating heat. When a high power laser such as a carbon dioxide laser or a YAG laser is used as the infrared laser, a large quantity of heat is generated in the laser-irradiated area, and molecules in the crosslinked relief-forming layer undergo molecular scission or ionization, thus being selectively removed, that is, engraved. The advantage of laser engraving is that, since the depth of engraving can be set freely, it is possible to control the structure three-dimensionally. For example, for an area where fine halftone dots are printed, carrying out engraving shallowly or with a shoulder prevents the relief from collapsing due to printing pressure, and for a groove area where a fine outline character is printed, carrying out engraving deeply makes it difficult for ink the groove to be blocked with ink, thus enabling breakup of an outline character to be suppressed.

In particular, when engraving is carried out using an infrared laser that corresponds to the absorption wavelength of the photothermal conversion agent, it becomes possible to selectively remove the crosslinked relief-forming layer at higher sensitivity, thus giving a relief layer having a sharp image.

As the infrared laser used in the engraving step, from the viewpoint of productivity, cost, etc., a carbon dioxide laser ($CO_2$ laser) or a semiconductor laser is preferable. In particular, a fiber-coupled semiconductor infrared laser (FC-LD) is preferably used. In general, compared with a $CO_2$ laser, a semiconductor laser has higher efficiency laser oscillation, is less expensive, and can be made smaller. Furthermore, it is easy to form an array due to the small size. Moreover, the shape of the beam can be controlled by treatment of the fiber.

With regard to the semiconductor laser, one having a wavelength of 700 to 1,300 nm may be used, but one having a wavelength of 800 to 1,200 nm is preferable, one having a wavelength of 860 to 1,200 nm is more preferable, and one having a wavelength of 900 to 1,100 nm is particularly preferable.

Furthermore, the fiber-coupled semiconductor laser can output laser light efficiently by being equipped with optical fiber, and this is effective in the engraving step in the present invention. Moreover, the shape of the beam can be controlled by treatment of the fiber. For example, the beam profile may be a top hat shape, and energy can be applied stably to the plate face. Details of semiconductor lasers are described in 'Laser Handbook $2^{nd}$ Edition' (The Laser Society of Japan), 'Jitsuyo Laser Gijutsu' (Applied Laser Technology) (The Institute of Electronics and Communication Engineers), etc.

Moreover, as plate making equipment comprising a fiber-coupled semiconductor laser that can be used suitably in the process for making a relief printing plate employing the relief printing plate precursor of the present invention, those described in detail in JP-A-2009-172658 and JP-A-2009-214334 can be cited.

The process for making a relief printing plate of the present invention may as necessary further comprise, subsequent to the engraving step, a rinsing step, a drying step, and/or a post-crosslinking step, which are shown below.

Rinsing step: a step of rinsing the engraved surface by rinsing the engraved relief layer surface with water or a liquid containing water as a main component.

Drying step: a step of drying the engraved relief layer.

Post-crosslinking step: a step of further crosslinking the relief layer by applying energy to the engraved relief layer.

After the above-mentioned step, since engraving residue is attached to the engraved surface, a rinsing step of washing off engraving residue by rinsing the engraved surface with water or a liquid containing water as a main component may be added. Examples of rinsing means include a method in which washing is carried out with tap water, a method in which high pressure water is spray-jetted, and a method in which the engraved surface is brushed in the presence of mainly water using a batch or conveyor brush type washout machine known as a photosensitive resin letterpress plate processor, and when slime due to engraving residue cannot be eliminated, a rinsing liquid to which a soap or a surfactant is added may be used.

When the rinsing step of rinsing the engraved surface is carried out, it is preferable to add a drying step of drying an engraved relief-forming layer so as to evaporate rinsing liquid.

Furthermore, as necessary, a post-crosslinking step for further crosslinking the relief-forming layer may be added. By carrying out a post-crosslinking step, which is an additional crosslinking step, it is possible to further strengthen the relief formed by engraving.

The pH of the rinsing liquid that can be used in the present invention is preferably at least 9, more preferably at least 10, and yet more preferably at least 11. The pH of the rinsing liquid is preferably no greater than 14, more preferably no greater than 13.5, yet more preferably no greater than 13.2, particularly preferably no greater than 13, and most preferably no greater than 12.5. When in the above-mentioned range, handling is easy.

In order to set the pH of the rinsing liquid in the above-mentioned range, the pH may be adjusted using an acid and/or a base as appropriate, and the acid or base used is not particularly limited.

The rinsing liquid that can be used in the present invention preferably comprises water as a main component.

The rinsing liquid may contain as a solvent other than water a water-miscible solvent such as an alcohol, acetone, or tetrahydrofuran.

The rinsing liquid preferably comprises a surfactant.

From the viewpoint of removability of engraving residue and little influence on a relief printing plate, preferred examples of the surfactant that can be used in the present invention include betaine compounds (amphoteric surfactants) such as a carboxybetaine compound, a sulfobetaine compound, a phosphobetaine compound, an amine oxide compound, and a phosphine oxide compound.

The betaine compound is preferably a compound represented by Formula (1) below and/or a compound represented by Formula (2) below.

(1)

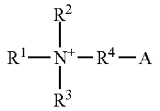

(In Formula (1), $R^1$ to $R^3$ independently denote a monovalent organic group, $R^4$ denotes a single bond or a divalent linking group, A denotes $PO(OR^6)O^-$, $OPO(OR^6)O^-$, $O^-$, $COO^-$, or $SO_3^-$, $R^5$ denotes a hydrogen atom or a monovalent organic group, and two or more groups of $R^1$ to $R^3$ may be bonded to each other to form a ring.)

(2)

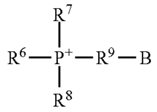

(In Formula (2), $R^6$ to $R^8$ independently denote a monovalent organic group, $R^9$ denotes a single bond or a divalent linking group, B denotes $PO(OR^{10})O^-$, $OPO(OR^{10})O^-$, $O^-$, $COO^-$, or $SO_3^-$, $R^{10}$ denotes a hydrogen atom or a monovalent organic group, and two or more groups of $R^6$ to $R^8$ may be bonded to each other to form a ring.)

The compound represented by Formula (1) above or the compound represented by Formula (2) above is preferably a carboxybetaine compound, a sulfobetaine compound, a phosphobetaine compound, an amine oxide compound, or a phosphine oxide compound. In the present invention, the structures of N═O of an amine oxide compound and P═O of a phosphine oxide compound are considered to be $N^+$—$O^-$ and $P^+$—$O^-$ respectively.

$R^1$ to $R^3$ in Formula (1) above independently denote a monovalent organic group. Two or more groups of $R^1$ to $R^3$ may be bonded to each other to form a ring, but it is preferable that no ring is formed.

The monovalent organic group denoted by $R^1$ to $R^3$ is not particularly limited, but is preferably an alkyl group, a hydroxy group-containing alkyl group, an alkyl group having an amide bond in an alkyl chain, or an alkyl group having an ether bond in an alkyl chain, and is more preferably an alkyl group, a hydroxy group-containing alkyl group, or an alkyl group having an amide bond in an alkyl chain.

Furthermore, the alkyl group as the monovalent organic group may have a straight chain, branched, or cyclic structure.

Moreover, it is particularly preferable that two of $R^1$ to $R^3$ are methyl groups, that is, a compound represented by Formula (1) has an N,N-dimethyl structure. When it has the above-mentioned structure, particularly good rinsing properties are exhibited.

$R^4$ in Formula (1) above denotes a single bond or a divalent linking group, and is a single bond when a compound represented by Formula (1) is an amine oxide compound.

The divalent linking group denoted by $R^4$ is not particularly limited, and is preferably an alkylene group or a hydroxy group-containing alkylene group, more preferably an alkylene group having 1 to 8 carbon atoms or a hydroxy group-containing alkylene group having 1 to 8 carbon atoms, and yet more preferably an alkylene group having 1 to 3 carbon atoms or a hydroxy group-containing-alkylene group having 1 to 3 carbon atoms.

A in Formula (1) above denotes $PO(OR^5)O^-$, $OPO(OR^5)O^-$, $O^-$, $COO^-$, or $SO_3^-$, and is preferably $O^-$, $COO^-$, or $SO_3^-$, and more preferably $COO^-$.

When $A^-$ is $O^-$, $R^4$ is preferably a single bond.

$R^5$ in $PO(OR^5)O^-$ and $OPO(OR^5)O^-$ denotes a hydrogen atom or a monovalent organic group, and is preferably a hydrogen atom or an alkyl group having one or more unsaturated fatty acid ester structures.

Furthermore, $R^4$ is preferably a group that does not have $PO(OR^5)O^-$, $OPO(OR^5)O^-$, $O^-$, $COO^-$, or $SO_3^-$.

$R^6$ to $R^8$ in Formula (2) above independently denote a monovalent organic group. Two or more groups of $R^6$ to $R^8$ may be bonded to each other to form a ring, but it is preferable that no ring is formed.

The monovalent organic group denoted by $R^6$ to $R^8$ is not particularly limited, but is preferably an alkyl group, an alkenyl group, an aryl group, or a hydroxy group, and more preferably an alkenyl group, an aryl group, or a hydroxy group.

Furthermore, the alkyl group as the monovalent organic group may have a straight chain, branched, or cyclic structure.

It is particularly preferable that two of $R^6$ to $R^8$ are aryl groups.

$R^9$ in Formula (2) above denotes a single bond or a divalent linking group, and is a single bond when a compound represented by Formula (2) is a phosphine oxide compound.

The divalent linking group denoted by $R^9$ is not particularly limited, but is preferably an alkylene group or a hydroxy group-containing alkylene group, more preferably an alkylene group having 1 to 8 carbon atoms or a hydroxy group-containing alkylene group having 1 to 8 carbon atoms, and yet more preferably an alkylene group having 1 to 3 carbon atoms or a hydroxy group-containing alkylene group having 1 to 3 carbon atoms.

B in Formula (2) above denotes $PO(OR^{10})O^-$, $OPO(OR^{10})O^-$, $O^-$, $COO^-$, or $SO_3^-$, and is preferably $O^-$.

$R^9$ is preferably a single bond when $B^-$ is $O^-$.

$R^{10}$ in $PO(OR^{10})O^-$ and $OPO(OR^{10})O^-$ denotes a hydrogen atom or a monovalent organic group, and is preferably a hydrogen atom or an alkyl group having one or more unsaturated fatty acid ester structures.

Furthermore, $R^9$ is preferably a group that does not have $PO(OR^{10})O^-$, $OPO(OR^{10})O^-$, $O^-$, $COO^-$, or $SO_3^-$.

A compound represented by Formula (1) is preferably a compound represented by Formula (3) below.

(3)

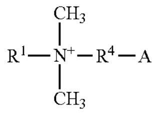

(In Formula (3), $R^1$ denotes a monovalent organic group, $R^4$ denotes a single bond or a divalent linking group, A denotes $PO(OR^5)O^-$, $OPO(OR^5)O^-$, $O^-$, $COO^-$, or $SO_3^-$, and $R^5$ denotes a hydrogen atom or a monovalent organic group.)

$R^1$, A, and $R^5$ in Formula (3) have the same meanings as $R^1$, A, and $R^5$ in Formula (1) above, and preferred ranges are also the same.

A compound represented by Formula (2) is preferably a compound represented by Formula (4) below.

(4)

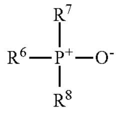

(In Formula (4), $R^6$ to $R^8$ independently denote an alkyl group, an alkenyl group, an aryl group, or a hydroxy group. In addition, not all of $R^6$ to $R^8$ are the same groups.)

$R^6$ to $R^8$ in Formula (4) above independently denote an alkyl group, an alkenyl group, an aryl group, or a hydroxy group, and are preferably an alkenyl group, an aryl group, or a hydroxy group.

Specific examples of the compound represented by Formula (1) and the compound represented by Formula (2) include the compounds below.

(1-A)
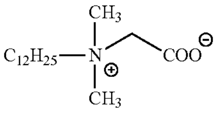
(1-B)
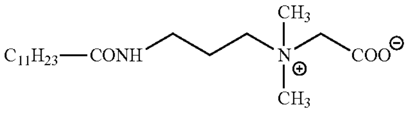
(1-C)
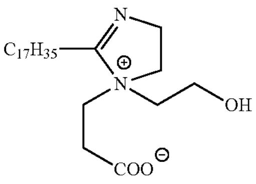
(1-D)
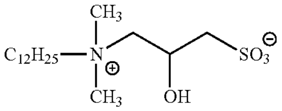
(1-E)
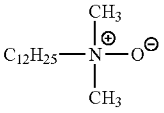
(1-F)
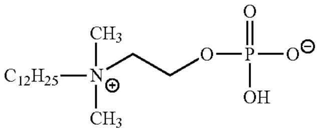
(1-G)
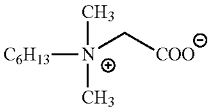
(1-H)
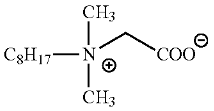
(1-I)
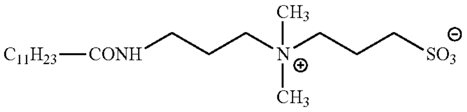
(1-J)
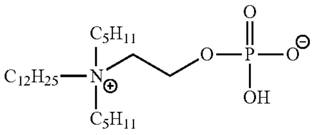
(1-K)
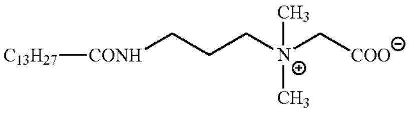
(1-L)
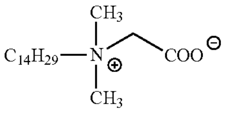
(1-M)
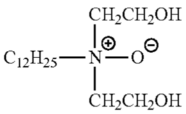
(1-N)
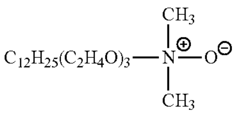
(1-O)
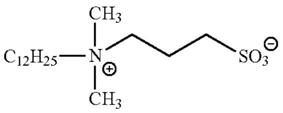
(1-P)
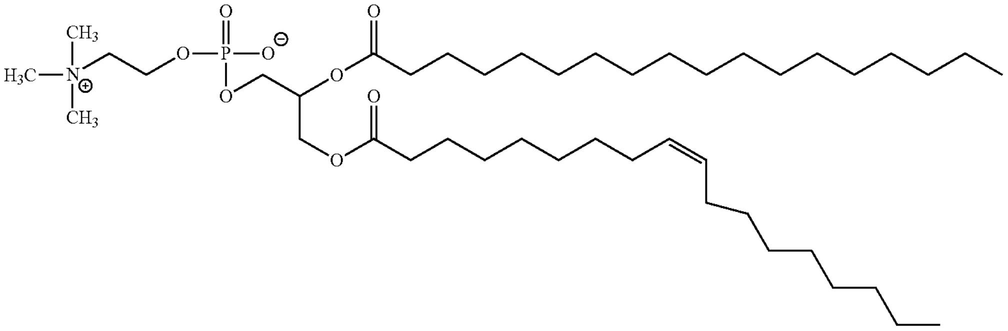
(1-Q)
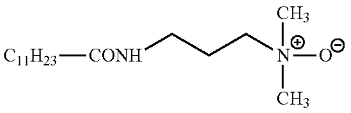
(2-A)
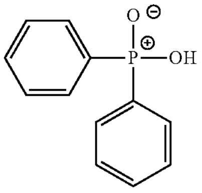

-continued (2-B)

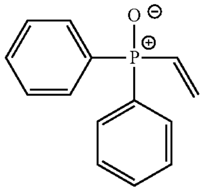

Furthermore, examples of the surfactant also include known anionic surfactants, cationic surfactants, amphoteric surfactants, and nonionic surfactants. Moreover, a fluorine-based or silicone-based nonionic surfactant may also be used in the same manner.

With regard to the surfactant, one type may be used on its own or two or more types may be used in combination.

It is not necessary to particularly limit the amount of surfactant used, but it is preferably 0.01 to 20 mass % relative to the total mass of the rinsing liquid, and more preferably 0.05 to 10 mass %.

The relief printing plate of the present invention having a relief layer may be produced as described above.

From the viewpoint of satisfying suitability for various aspects of flexographic printing, such as abrasion resistance and ink transfer properties, the thickness of the relief layer of the relief printing plate is preferably at least 0.05 mm but no greater than 10 mm, more preferably at least 0.05 mm but no greater than 7 mm, and yet more preferably at least 0.05 mm but no greater than 3 mm.

Furthermore, the Shore A hardness of the relief layer of the relief printing plate is preferably at least 50° but no greater than 90°. When the Shore A hardness of the relief layer is at least 50°, even if fine halftone dots formed by engraving receive a strong printing pressure from a letterpress printer, they do not collapse and close up, and normal printing can be carried out. Furthermore, when the Shore A hardness of the relief layer is no greater than 90°, even for flexographic printing with kiss touch printing pressure it is possible to prevent patchy printing in a solid printed part.

The Shore A hardness in the present specification is a value measured by a durometer (a spring type rubber hardness meter) that presses an indenter (called a pressing needle or indenter) into the surface of a measurement target at 25° C. so as to deform it, measures the amount of deformation (indentation depth), and converts it into a numerical value.

The relief printing plate of the present invention is particularly suitable for printing by a flexographic printer using a UV ink, but printing is also possible when it is carried out by a letterpress printer using any of aqueous, oil-based, and UV inks, and it is also suitable for printing by a flexographic printer using an aqueous ink. The relief printing plate of the present invention has excellent rinsing properties, there is no engraving residue, since a relief layer obtained has excellent elasticity UV ink and aqueous ink transfer properties and printing durability are excellent, and printing can be carried out for a long period of time without plastic deformation of the relief layer or degradation of printing durability.

EXAMPLES

The present invention is explained in further detail below by reference to Examples, but the present invention should not be construed as being limited to these Examples.

Example 1

1. Preparation of Thermally Crosslinkable Resin Composition 1 for Laser Engraving Resin composition 1 (thermally crosslinkable resin composition 1 for laser engraving) was obtained by mixing and kneading the components shown below using a Labo Plastomill.

(Component A) organic silane compound A-1: 10 parts by mass (Component B) binder polymer B-1 (styrene butadiene rubber, TR2000, JSR): 100 parts by mass (Component C) peroxide C-1 (2,2-bis(tert-butylperoxy)butane, Perhexa 22, peroxyketal, NOF Corporation): 2 parts by mass

2. Preparation of Relief Printing Plate Precursor 1 for Laser Engraving

Resin composition 1 obtained above was subjected to a heat treatment using a hot press at 160° C. for 30 minutes, thus giving relief printing plate precursor 1 for laser engraving comprising an approximately 1 mm thick crosslinked relief-forming layer.

3. Preparation of Relief Printing Plate 1

(Laser Engraving)

The relief-forming layer after crosslinking (crosslinked relief-forming layer) was engraved using the two types of laser below.

As a carbon dioxide laser ($CO_2$ laser) engraving machine, for engraving by irradiation with a laser, an ML-9100 series high quality $CO_2$ laser marker (Keyence) was used. After a protection film was peeled off from the printing plate precursor 1 for laser engraving, a 1 cm square solid printed part was raster-engraved using the carbon dioxide laser engraving machine under conditions of an output of 12 W, a head speed of 200 mm/sec, and a pitch setting of 2,400 DPI.

As a semiconductor laser engraving machine, laser recording equipment provided with an SDL-6390 fiber-coupled semiconductor laser (FC-LD) (JDSU, wavelength 915 nm) with a maximum power of 8.0 W was used. A 1 cm square solid printed part was raster-engraved using the semiconductor laser engraving machine under conditions of a laser output of 7.5 W, a head speed of 409 mm/sec, and a pitch setting of 2,400 DPI.

The thickness of the relief layer of the relief printing plate was approximately 1 mm (1.25 mm).

Furthermore, when the Shore A hardness of the relief layer was measured by the above-mentioned measurement method, it was found to be 75°. Measurement of Shore A hardness was carried out in the same manner for the Examples and Comparative Examples described below.

Examples 2 to 94 and Comparative Examples 1 to 12

Thermally crosslinkable resin compositions for laser engraving, relief printing plate precursors for laser engraving, and relief printing plates of Examples 2 to 94 and Comparative Examples 1 to 12 were obtained by the same method as in Example 1 using the components described in Tables 1 and 2.

The amount of each component used in each thermally crosslinkable resin composition for laser engraving was as described below, and the components described in Table 1 were used. (Component A): 10 parts by mass, (Component B): 100 parts by mass, (Component C): 2 parts by mass, (Component D): 15 parts by mass, (component E): 1 part by mass, (component F): 10 parts by mass (Evaluation)

<Evaluation of Rinsing Properties>

A rinsing liquid was prepared by mixing water, a 10 wt % aqueous solution of sodium hydroxide, and betaine compound (1-B) below so that the pH was 12 and the content of betaine compound (1-B) was 1 mass % of the total rinsing liquid.

A plate that had been laser-engraved by the above-mentioned method was immersed in the above rinsing liquid and allowed to stand for 10 minutes, and the engraved part was then rubbed 10 times using a toothbrush (Clinica Toothbrush Flat, Lion Corporation) in parallel to the plate with a load of 200 gf. Subsequently, the plate face was washed with running water, and the presence/absence of residue on the surface of the relief layer was checked by an optical microscope. When there was no residue, the evaluation was Excellent, when there was hardly any residue the evaluation was Good, when there was some residue remaining the evaluation was Fair, and when the residue could not be removed the evaluation was Poor.

(1-B)

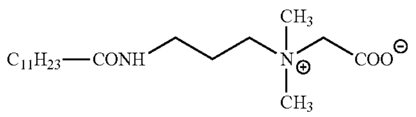

<Evaluation of UV Ink Suitability>

A plate was immersed in a UV ink (UV Flexo 500 Indigo, T&K Toka Company). After being allowed to stand at room temperature for 24 hours the plate was taken out, the ink was wiped off from the surface, it was weighed, and the percentage mass decrease was calculated from the mass before immersion. When the percentage mass decrease was less than 5%, it was evaluated as Good, at least 5% but less than 7% as Fair, and 7% or greater as Poor.

The results are shown in the Tables below.

TABLE 1

| | Comp. A | Comp. B | Comp. C | Comp. D | Comp. E | Comp. F | Relief layer Thickness (mm) | Shore hardness (°) | Laser for engraving | Engraving depth (μm) | Rinsing properties | UV ink suitability |
|---|---|---|---|---|---|---|---|---|---|---|---|---|
| Ex. 1 | A-1 | B-1 | C-1 | — | — | — | 1.25 | 75 | Semicond. laser | 475 | Good | Fair |
| Ex. 2 | A-1 | B-1 | C-1 | D-1 | — | — | 1.33 | 78 | Semicond. laser | 465 | Excellent | Good |
| Ex. 3 | A-1 | B-1 | C-1 | — | E-1 | — | 1.32 | 75 | Semicond. laser | 470 | Good | Fair |
| Ex. 4 | A-1 | B-1 | C-1 | — | — | F-1 | 1.30 | 71 | Semicond. laser | 475 | Good | Fair |
| Ex. 5 | A-1 | B-1 | C-1 | D-1 | E-1 | — | 1.25 | 68 | Semicond. laser | 460 | Excellent | Good |
| Ex. 6 | A-1 | B-1 | C-1 | D-1 | — | F-1 | 1.28 | 73 | Semicond. laser | 465 | Excellent | Good |
| Ex. 7 | A-1 | B-1 | C-1 | — | E-1 | F-1 | 1.33 | 73 | Semicond. laser | 485 | Good | Fair |
| Ex. 8 | A-1 | B-1 | C-1 | D-1 | E-1 | F-1 | 1.22 | 72 | Semicond. laser | 480 | Excellent | Good |
| Ex. 9 | A-1 | B-1 | C-2 | D-1 | E-1 | F-1 | 1.33 | 81 | Semicond. laser | 475 | Excellent | Good |
| Ex. 10 | A-1 | B-1 | C-3 | D-1 | E-1 | F-1 | 1.41 | 77 | Semicond. laser | 475 | Excellent | Good |
| Ex. 11 | A-1 | B-1 | C-4 | D-1 | E-1 | F-1 | 1.19 | 75 | Semicond. laser | 470 | Good | Good |
| Ex. 12 | A-1 | B-1 | C-5 | D-1 | E-1 | F-1 | 1.28 | 71 | Semicond. laser | 465 | Good | Fair |
| Ex. 13 | A-2 | B-1 | C-1 | D-1 | E-1 | F-1 | 1.11 | 73 | Semicond. laser | 455 | Good | Good |
| Ex. 14 | A-3 | B-1 | C-1 | D-1 | E-1 | F-1 | 1.07 | 79 | Semicond. laser | 460 | Excellent | Good |
| Ex. 15 | A-4 | B-1 | C-2 | D-1 | E-1 | F-1 | 1.23 | 75 | Semicond. laser | 470 | Good | Good |
| Ex. 16 | A-5 | B-1 | C-2 | D-1 | E-1 | F-1 | 1.30 | 76 | Semicond. laser | 480 | Excellent | Good |
| Ex. 17 | A-6 | B-1 | C-2 | D-1 | E-1 | F-1 | 1.22 | 82 | Semicond. laser | 465 | Excellent | Good |
| Ex. 18 | A-7 | B-1 | C-2 | D-1 | E-1 | F-1 | 1.16 | 88 | Semicond. laser | 475 | Good | Good |
| Ex. 19 | A-8 | B-1 | C-1 | D-1 | E-2 | F-2 | 1.21 | 79 | Semicond. laser | 475 | Excellent | Good |
| Ex. 20 | A-9 | B-1 | C-1 | D-2 | E-2 | F-2 | 1.15 | 83 | Semicond. laser | 465 | Good | Good |
| Ex. 21 | A-10 | B-1 | C-1 | D-2 | E-2 | F-2 | 1.11 | 81 | Semicond. laser | 470 | Good | Good |
| Ex. 22 | A-11 | B-1 | C-1 | D-2 | E-2 | F-1 | 1.18 | 82 | Semicond. laser | 475 | Excellent | Good |
| Ex. 23 | A-12 | B-1 | C-1 | D-1 | E-2 | F-1 | 1.12 | 83 | Semicond. laser | 460 | Excellent | Good |
| Ex. 24 | A-13 | B-1 | C-1 | D-1 | E-1 | F-1 | 1.33 | 72 | Semicond. laser | 465 | Good | Good |
| Ex. 25 | A-14 | B-1 | C-1 | D-1 | E-1 | F-1 | 1.31 | 73 | Semicond. laser | 485 | Excellent | Good |
| Ex. 26 | A-15 | B-2 | C-1 | D-1 | E-1 | F-1 | 1.18 | 80 | Semicond. laser | 480 | Excellent | Fair |
| Ex. 27 | A-16 | B-3 | C-1 | D-1 | E-1 | F-1 | 1.25 | 73 | Semicond. laser | 455 | Excellent | Fair |
| Ex. 28 | A-17 | B-1 | C-1 | D-1 | E-1 | F-1 | 1.22 | 77 | Semicond. laser | 455 | Excellent | Good |
| Ex. 29 | A-18 | B-1 | C-1 | D-1 | E-1 | F-1 | 1.19 | 78 | Semicond. laser | 460 | Excellent | Good |
| Ex. 30 | A-19 | B-1 | C-3 | D-2 | E-1 | F-1 | 1.22 | 74 | Semicond. laser | 475 | Excellent | Good |
| Ex. 31 | A-20 | B-1 | C-3 | D-2 | E-1 | F-1 | 1.11 | 82 | Semicond. laser | 460 | Excellent | Good |
| Ex. 32 | A-21 | B-1 | C-1 | D-2 | E-1 | F-1 | 1.07 | 86 | Semicond. laser | 475 | Excellent | Good |
| Ex. 33 | A-22 | B-1 | C-1 | D-1 | E-1 | F-1 | 1.23 | 78 | Semicond. laser | 475 | Good | Good |
| Ex. 34 | A-23 | B-1 | C-1 | D-1 | E-1 | F-1 | 1.30 | 72 | Semicond. laser | 455 | Good | Good |
| Ex. 35 | A-24 | 8-1 | C-1 | D-1 | E-1 | F-1 | 1.27 | 77 | Semicond. laser | 455 | Good | Good |
| Ex. 36 | A-14 | B-2 | C-1 | D-1 | E-1 | F-1 | 1.22 | 73 | Semicond. laser | 475 | Excellent | Good |
| Ex. 37 | A-14 | B-3 | C-1 | D-1 | E-1 | F-1 | 1.16 | 80 | Semicond. laser | 465 | Excellent | Good |
| Ex. 38 | A-14 | B-4 | C-1 | D-1 | E-1 | F-1 | 1.21 | 73 | Semicond. laser | 470 | Excellent | Good |
| Ex. 39 | A-14 | B-5 | C-1 | D-1 | E-1 | F-1 | 1.18 | 86 | Semicond. laser | 475 | Excellent | Good |
| Ex. 40 | A-14 | B-6 | C-1 | D-1 | E-1 | F-1 | 1.17 | 85 | Semicond. laser | 475 | Good | Good |

TABLE 1-continued

| | Relief layer | | | | | | | | | | | |
|---|---|---|---|---|---|---|---|---|---|---|---|---|
| | Comp. A | Comp. B | Comp. C | Comp. D | Comp. E | Comp. F | Thickness (mm) | Shore hardness (°) | Laser for engraving | Engraving depth (μm) | Rinsing properties | UV ink suitability |
| Ex. 41 | A-14 | B-7 | C-1 | D-1 | E-1 | F-1 | 1.25 | 71 | Semicond. laser | 455 | Excellent | Good |
| Ex. 42 | A-14 | B-8 | C-1 | D-1 | E-1 | F-1 | 1.21 | 76 | Semicond. laser | 475 | Excellent | Good |
| Ex. 43 | A-14 | B-9 | C-1 | D-1 | E-1 | F-1 | 1.14 | 82 | Semicond. laser | 465 | Excellent | Good |
| Ex. 44 | A-14 | B-10 | C-1 | D-1 | E-1 | F-1 | 1.09 | 88 | Semicond. laser | 470 | Excellent | Good |
| Ex. 45 | A-14 | B-11 | C-1 | D-1 | E-1 | F-1 | 1.15 | 79 | Semicond. laser | 475 | Excellent | Good |
| Ex. 46 | A-14 | B-12 | C-1 | D-1 | E-1 | F-1 | 1.11 | 83 | Semicond. laser | 460 | Excellent | Good |
| Ex. 47 | A-14 | B-13 | C-1 | D-1 | E-1 | F-1 | 1.21 | 94 | Semicond. laser | 460 | Excellent | Fair |
| Comp. Ex. 1 | — | B-1 | C-1 | | E-1 | F-1 | 1.30 | 76 | Semicond. laser | 480 | Poor | Fair |
| Comp. Ex. 2 | — | B-3 | C-1 | D-1 | E-1 | F-1 | 1.22 | 79 | Semicond. laser | 465 | Poor | Good |
| Comp. Ex. 3 | — | B-8 | C-1 | D-1 | E-1 | F-1 | 1.16 | 73 | Semicond. laser | 475 | Poor | Good |
| Comp. Ex. 4 | — | B-12 | C-1 | D-1 | E-1 | F-1 | 1.21 | 80 | Semicond. laser | 475 | Poor | Good |
| Comp. Ex. 5 | A-12 | B-1 | — | D-1 | E-2 | F-1 | 1.18 | 75 | Semicond. laser | 465 | Fair | Poor |
| Comp. Ex. 6 | A-12 | B-10 | — | D-1 | E-1 | F-1 | 1.17 | 83 | Semicond. laser | 470 | Fair | Poor |

TABLE 2

| | Relief layer | | | | | | | | | | | |
|---|---|---|---|---|---|---|---|---|---|---|---|---|
| | Comp. A | Comp. B | Comp. C | Comp. D | Comp. E | Comp. F | Thickness (mm) | Shore hardness (°) | Laser for engraving | Engraving depth (μm) | Rinsing properties | UV ink suitability |
| Ex. 48 | A-1 | B-1 | C-1 | — | — | — | 1.25 | 75 | Carbon dioxide laser | 175 | Good | Fair |
| Ex. 49 | A-1 | B-1 | C-1 | D-1 | — | — | 1.33 | 78 | Carbon dioxide laser | 165 | Excellent | Good |
| Ex. 50 | A-1 | B-1 | C-1 | — | E-1 | — | 1.32 | 75 | Carbon dioxide laser | 170 | Good | Fair |
| Ex. 51 | A-1 | B-1 | C-1 | — | — | F-1 | 1.30 | 71 | Carbon dioxide laser | 175 | Good | Fair |
| Ex. 52 | A-1 | B-1 | C-1 | D-1 | E-1 | — | 1.25 | 68 | Carbon dioxide laser | 160 | Excellent | Good |
| Ex. 53 | A-1 | B-1 | C-1 | D-1 | — | F-1 | 1.28 | 73 | Carbon dioxide laser | 165 | Excellent | Good |
| Ex. 54 | A-1 | B-1 | C-1 | — | E-1 | F-1 | 1.33 | 73 | Carbon dioxide laser | 185 | Good | Fair |
| Ex. 55 | A-1 | B-1 | C-1 | D-1 | E-1 | F-1 | 1.22 | 72 | Carbon dioxide laser | 180 | Excellent | Good |
| Ex. 56 | A-1 | B-1 | C-2 | D-1 | E-1 | F-1 | 1.33 | 81 | Carbon dioxide laser | 175 | Excellent | Good |
| Ex. 57 | A-1 | B-1 | C-3 | D-1 | E-1 | F-1 | 1.41 | 77 | Carbon dioxide laser | 175 | Excellent | Good |
| Ex. 58 | A-1 | B-1 | C-4 | D-1 | E-1 | F-1 | 1.19 | 75 | Carbon dioxide laser | 170 | Good | Good |
| Ex. 59 | A-1 | B-1 | C-5 | D-1 | E-1 | F-1 | 1.28 | 71 | Carbon dioxide laser | 165 | Good | Fair |
| Ex. 60 | A-2 | B-1 | C-1 | D-1 | E-1 | F-1 | 1.11 | 73 | Carbon dioxide laser | 155 | Good | Good |
| Ex. 61 | A-3 | B-1 | C-1 | D-1 | E-1 | F-1 | 1.07 | 79 | Carbon dioxide laser | 160 | Excellent | Good |
| Ex. 62 | A-4 | B-1 | C-2 | D-1 | E-1 | F-1 | 1.23 | 75 | Carbon dioxide laser | 170 | Good | Good |
| Ex. 63 | A-5 | B-1 | C-2 | D-1 | E-1 | F-1 | 1.30 | 76 | Carbon dioxide laser | 180 | Excellent | Good |
| Ex. 64 | A-6 | B-1 | C-2 | D-1 | E-1 | F-1 | 1.22 | 82 | Carbon dioxide laser | 165 | Excellent | Good |
| Ex. 65 | A-7 | B-1 | C-2 | D-1 | E-1 | F-1 | 1.16 | 88 | Carbon dioxide laser | 175 | Good | Good |
| Ex. 66 | A-8 | B-1 | C-1 | D-1 | E-2 | F-2 | 1.21 | 79 | Carbon dioxide laser | 175 | Excellent | Good |
| Ex. 67 | A-9 | B-1 | C-1 | D-2 | E-2 | F-2 | 1.15 | 83 | Carbon dioxide laser | 165 | Good | Good |
| Ex. 68 | A-10 | B-1 | C-1 | D-2 | E-2 | F-2 | 1.11 | 81 | Carbon dioxide laser | 170 | Good | Good |
| Ex. 69 | A-11 | B-1 | C-1 | D-2 | E-2 | F-1 | 1.18 | 82 | Carbon dioxide laser | 175 | Excellent | Good |
| Ex. 70 | A-12 | B-1 | C-1 | D-1 | E-2 | F-1 | 1.12 | 83 | Carbon dioxide laser | 160 | Excellent | Good |
| Ex. 71 | A-13 | B-1 | C-1 | D-1 | E-1 | F-1 | 1.33 | 72 | Carbon dioxide laser | 165 | Good | Good |
| Ex. 72 | A-14 | B-1 | C-1 | D-1 | E-1 | F-1 | 1.31 | 73 | Carbon dioxide laser | 185 | Excellent | Good |
| Ex. 73 | A-15 | B-2 | C-1 | D-1 | E-1 | F-1 | 1.18 | 80 | Carbon dioxide laser | 180 | Excellent | Fair |
| Ex. 74 | A-16 | B-3 | C-1 | D-1 | E-1 | F-1 | 1.25 | 73 | Carbon dioxide laser | 155 | Excellent | Fair |
| Ex. 75 | A-17 | B-1 | C-1 | D-1 | E-1 | F-1 | 1.22 | 77 | Carbon dioxide laser | 155 | Excellent | Good |
| Ex. 76 | A-18 | B-1 | C-1 | D-1 | E-1 | F-1 | 1.19 | 78 | Carbon dioxide laser | 160 | Excellent | Good |
| Ex. 77 | A-19 | B-1 | C-3 | D-2 | E-1 | F-1 | 1.22 | 74 | Carbon dioxide laser | 175 | Excellent | Good |
| Ex. 78 | A-20 | B-1 | C-3 | D-2 | E-1 | F-1 | 1.11 | 82 | Carbon dioxide laser | 160 | Excellent | Good |
| Ex. 79 | A-21 | B-1 | C-1 | D-2 | E-1 | F-1 | 1.07 | 86 | Carbon dioxide laser | 175 | Excellent | Good |
| Ex. 80 | A-22 | B-1 | C-1 | D-1 | E-1 | F-1 | 1.23 | 78 | Carbon dioxide laser | 175 | Good | Good |
| Ex. 81 | A-23 | B-1 | C-1 | D-1 | E-1 | F-1 | 1.30 | 72 | Carbon dioxide laser | 155 | Good | Good |
| Ex. 82 | A-24 | B-1 | C-1 | D-1 | E-1 | F-1 | 1.27 | 77 | Carbon dioxide laser | 155 | Good | Good |
| Ex. 83 | A-14 | B-2 | C-1 | D-1 | E-1 | F-1 | 1.22 | 73 | Carbon dioxide laser | 175 | Excellent | Good |
| Ex. 84 | A-14 | B-3 | C-1 | D-1 | E-1 | F-1 | 1.16 | 80 | Carbon dioxide laser | 165 | Excellent | Good |
| Ex. 85 | A-14 | B-4 | C-1 | D-1 | E-1 | F-1 | 1.21 | 73 | Carbon dioxide laser | 170 | Excellent | Good |
| Ex. 86 | A-14 | B-5 | C-1 | D-1 | E-1 | F-1 | 1.18 | 86 | Carbon dioxide laser | 175 | Excellent | Good |
| Ex. 87 | A-14 | B-6 | C-1 | D-1 | E-1 | F-1 | 1.17 | 85 | Carbon dioxide laser | 175 | Good | Good |
| Ex. 88 | A-14 | B-7 | C-1 | D-1 | E-1 | F-1 | 1.25 | 71 | Carbon dioxide laser | 155 | Excellent | Good |
| Ex. 89 | A-14 | B-8 | C-1 | D-1 | E-1 | F-1 | 1.21 | 76 | Carbon dioxide laser | 175 | Excellent | Good |
| Ex. 90 | A-14 | B-9 | C-1 | D-1 | E-1 | F-1 | 1.14 | 82 | Carbon dioxide laser | 165 | Excellent | Good |

TABLE 2-continued

| | Comp. A | Comp. B | Comp. C | Comp. D | Comp. E | Comp. F | Relief layer Thickness (mm) | Shore hardness (°) | Laser for engraving | Engraving depth (μm) | Rinsing properties | UV ink suitability |
|---|---|---|---|---|---|---|---|---|---|---|---|---|
| Ex. 91 | A-14 | B-10 | C-1 | D-1 | E-1 | F-1 | 1.09 | 88 | Carbon dioxide laser | 170 | Excellent | Good |
| Ex. 92 | A-14 | B-11 | C-1 | D-1 | E-1 | F-1 | 1.15 | 79 | Carbon dioxide laser | 175 | Excellent | Good |
| Ex. 93 | A-14 | B-12 | C-1 | D-1 | E-1 | F-1 | 1.11 | 83 | Carbon dioxide laser | 160 | Excellent | Good |
| Ex. 94 | A-14 | B-13 | C-1 | D-1 | E-1 | F-1 | 1.21 | 94 | Carbon dioxide laser | 160 | Excellent | Fair |
| Comp. Ex. 7 | — | B-1 | C-1 | . | E-1 | F-1 | 1.30 | 76 | Carbon dioxide laser | 180 | Poor | Fair |
| Comp. Ex. 8 | — | B-3 | C-1 | D-1 | E-1 | F-1 | 1.22 | 79 | Carbon dioxide laser | 165 | Poor | Good |
| Comp. Ex. 9 | — | B-8 | C-1 | D-1 | E-1 | F-1 | 1.16 | 73 | Carbon dioxide laser | 175 | Poor | Good |
| Comp. Ex. 10 | — | B-12 | C-1 | D-1 | E-1 | F-1 | 1.21 | 80 | Carbon dioxide laser | 175 | Poor | Good |
| Comp. Ex. 11 | A-12 | B-1 | — | D-1 | E-2 | F-1 | 1.18 | 75 | Carbon dioxide laser | 165 | Fair | Poor |
| Comp. Ex. 12 | A-12 | B-10 | — | D-1 | E-1 | F-1 | 1.17 | 83 | Carbon dioxide laser | 170 | Fair | Poor |

The structural formula or compound name of each component used in the Examples and Comparative Examples is shown below.

<(Component A) Organic Silane Compound (Compound Having Hydrolyzable Silyl Group and/or Silanol Group)>

In the chemical structural formulae below, Et and Me denote an ethyl group and a methyl group respectively.

(A-1)

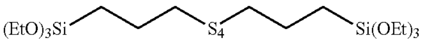

(A-2)

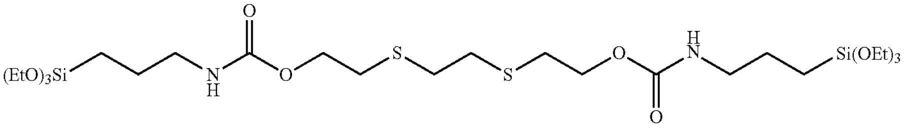

(A-3)

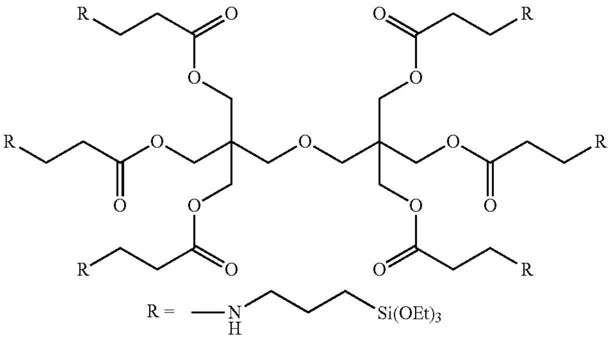

(A-4)

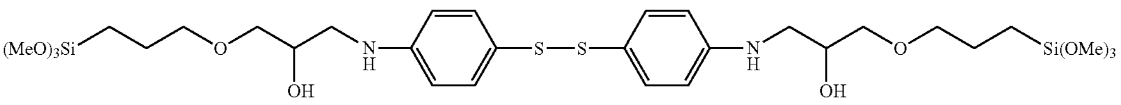

(A-5)

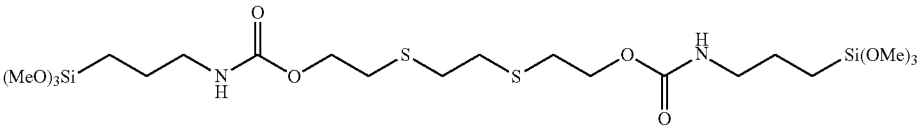

(A-6)

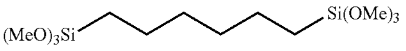

-continued
(A-7)
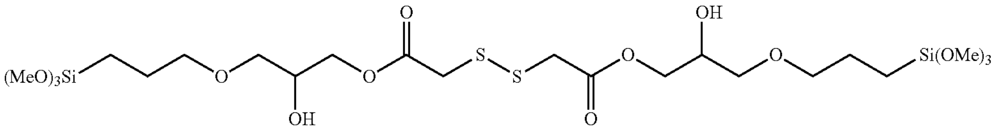
(A-8)
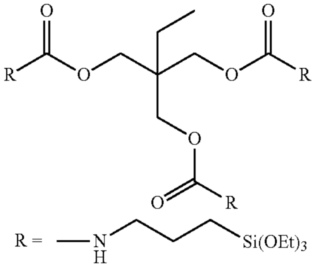
(A-9)
Mixture of
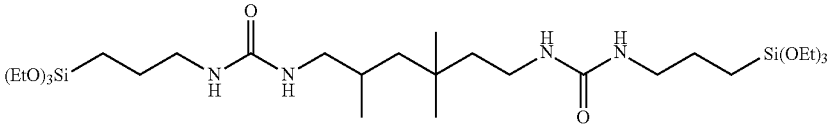
and
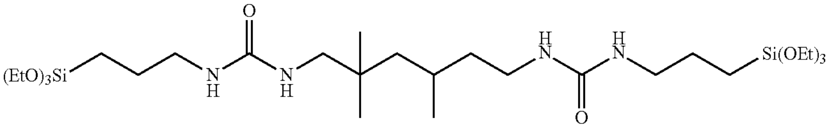
(A-10)
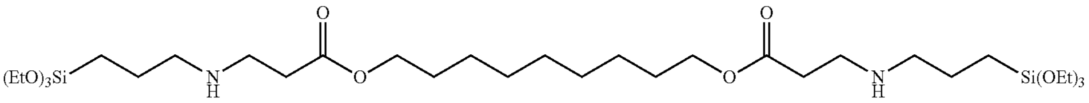
(A-11)
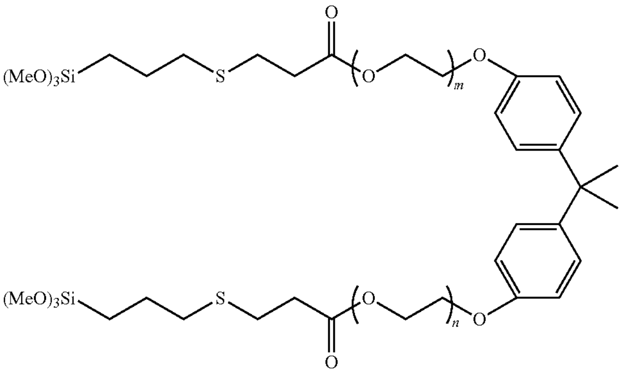
m + n = 4
(A-12)
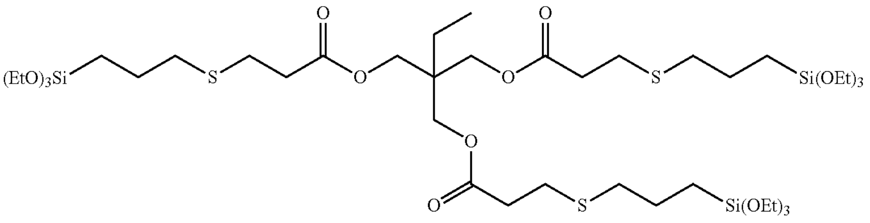

-continued
(A-13)
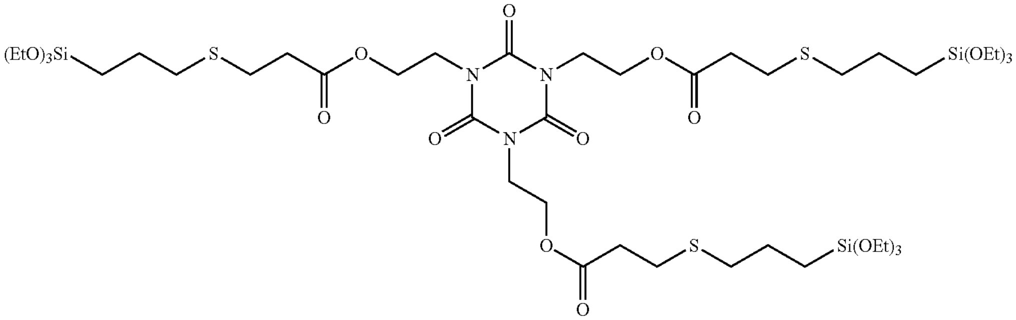
(A-14)
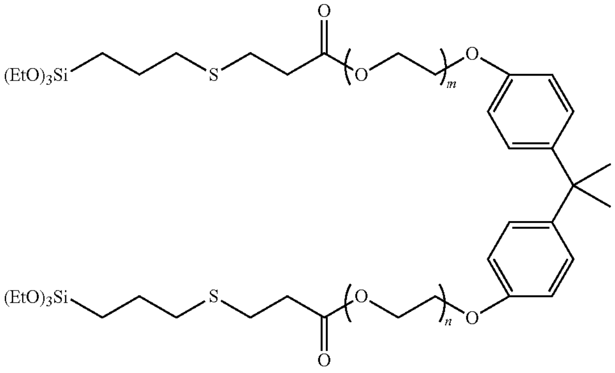
m + n = 10
(A-15)
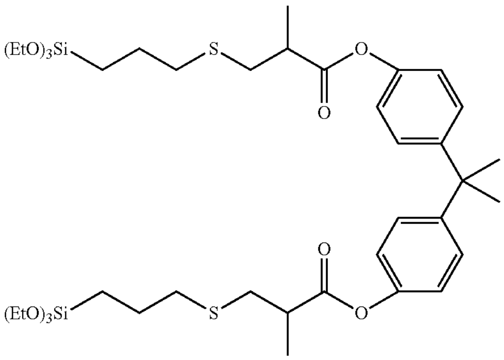
(A-16)
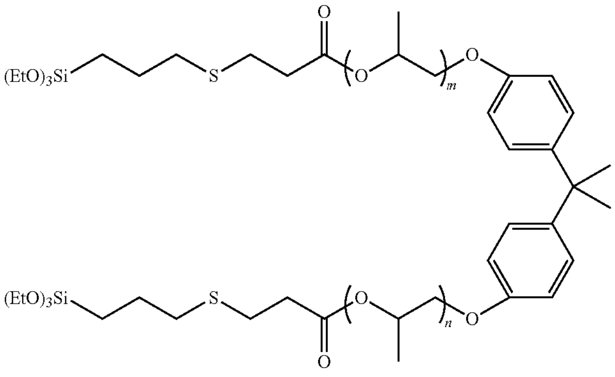
m + n = 4

-continued (A-17)

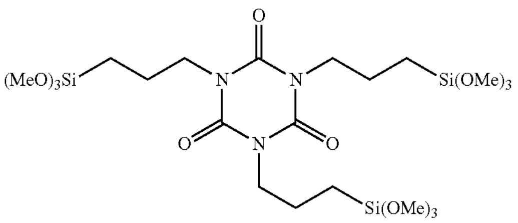

(A-18)

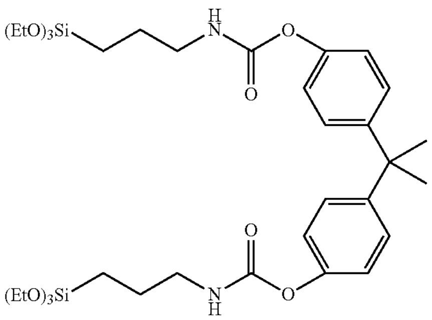

(A-19)

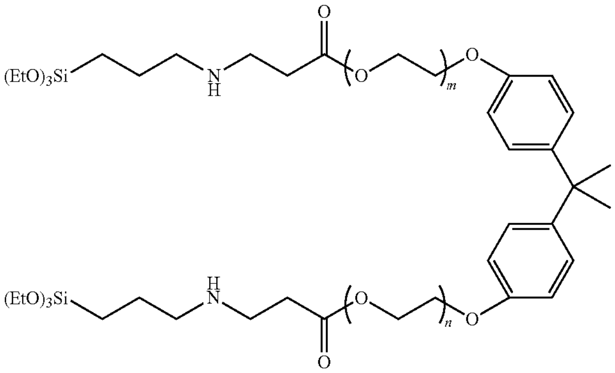

m + n = 4

(A-20)

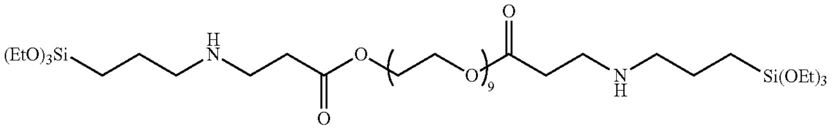

(A-21)

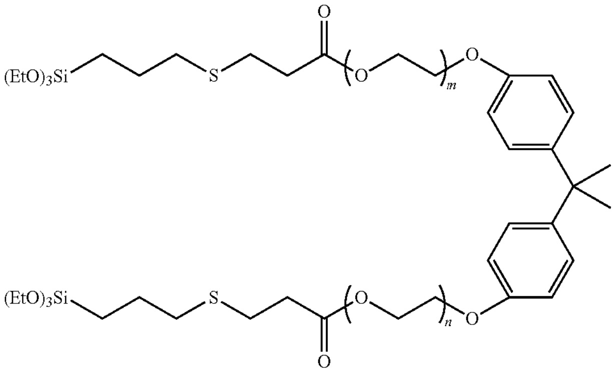

m + n = 4

(A-22)

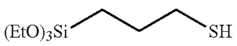

(A-23)

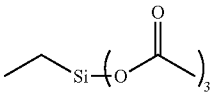

(A-24)

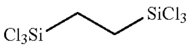

<(Component B) Binder Polymer>

B-1: styrene butadiene rubber (TR2000, JSR)

B-2: acrylonitrile butadiene rubber (N230S, JSR)

B-3: natural rubber (NR, Nomura Trading Co., Ltd.)

B-4: chloroprene rubber (Skyprene B-10, Tosoh Corporation)

B-5: styrene-isoprene-styrene block copolymer (SIS5200, JSR)

B-6: styrene-butadiene-styrene block copolymer (AR-130, Aronkasei Co., Ltd.)

B-7: isoprene rubber (IR2200, JSR)

B-8: butadiene rubber (BR01, JSR)
B-9: ethylene propylene rubber (EP11, JSR)
B-10: hydrogenated styrene butadiene rubber (DYNARON® 1320P, JSR)
B-11: ester-based polyurethane (Miractran® E-185, Nippon Miractran Co., Ltd.)
B-12: ethylene-vinyl acetate copolymer (Novatec™ EVA LV440, Nippon Polyurethane Industry Co., Ltd.)
B-13: poly(tert-butyl acrylate) (synthesized product, radical polymerization of tert-butyl acrylate) (Tg=73° C.)<
<(Component C) Peroxide>
C-1: 2,2-bis(tert-butylperoxy)butane (Perhexa 22, NOF Corporation, peroxyketal, 10-hour half-life temperature: 103.1° C.)
C-2: dicumyl peroxide (Percumyl D, NOF Corporation, dialkyl peroxide, 10-hour half-life temperature: 116.4° C.)
C-3: tert-butyl peroxybenzoate (Perbutyl Z, NOF Corporation, peroxyester, 10-hour half-life temperature: 104.3° C.)
C-4: dibenzoyl peroxide (Nyper BW, NOF Corporation, diacyl peroxide, 10-hour half-life temperature: 73.6° C.)
C-5: calcium peroxide (inorganic peroxide, Kanto Kagaku)<
<(Component D) Polymerizable Compound>
D-1: glycerol dimethacrylate (Tokyo Chemical Industry Co., Ltd.)
D-2: 1,6-hexanediol diacrylate (Tokyo Chemical Industry Co., Ltd.)
<(Component E) Fragrance>
E-1: vanillin (Wako Pure Chemical Industries, Ltd.)
E-2: I-menthol (Wako Pure Chemical Industries, Ltd.)
<(Component F) Photothermal Conversion Agent that can Absorb Light Having Wavelength of 700 to 1,300 nm>
F-1: Ketjen Black (EC600JD, Lion Corporation)
F-2: carbon black (N330, HAF (High Abrasion Furnace) carbon, Tokai Carbon Co., Ltd.)

As shown in Tables 1 and 2, the relief printing plates of the Examples prepared using resin compositions for laser engraving comprising Component A, Component B, and Component C have excellent rinsing properties and high productivity during plate making compared with the relief printing plates of the Comparative Examples. Furthermore, UV ink suitability (UV ink resistance) is good, excellent printing performance can be exhibited for a long period of time and, moreover, since the engraving depth is large, the engraving sensitivity is good. On the other hand, with regard to the relief layer of the Comparative Examples, crosslinking could not be carried out, or if crosslinking could be carried out, rinsing properties and UV ink suitability were poor.

In addition, a Component A having an ester bond, a urethane bond, and/or an ether bond in the molecule had good rinsing properties, and one having an oxyalkylene group was particularly good.

It can also be seen that, when the same relief printing plate precursors were used, engraving depth could be further improved by the use of plate making equipment comprising a fiber-coupled semiconductor laser and employing an FC-LD as a light source.

What is claimed is:

1. A process for making a relief printing plate, comprising:

a layer formation step of forming a relief-forming layer from a resin composition comprising (Component A) a compound having a hydrolyzable silyl group and/or a silanol group, (Component B) a binder polymer, and (Component C) a peroxide;

a crosslinking step of thermally crosslinking the relief-forming layer to thus obtain a relief printing plate precursor having a crosslinked relief-forming layer; and an engraving step of laser-engraving the relief printing plate precursor having a crosslinked relief-forming layer to thus form a relief layer, wherein Component A is a compound represented by Formula (A-1) or Formula (A-2) below;

(A-1)

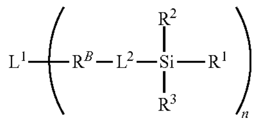

(A-2)

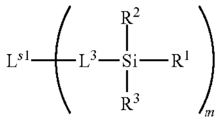

wherein, in Formula (A-1) and Formula (A-2), $R^B$ denotes an ester bond, an amide bond, a urethane bond, a urea bond, or an imino group, $L^1$ denotes an n-valent linking group, $L^2$ denotes a divalent linking group, $L^{s1}$ denotes an m-valent linking group, $L^3$ denotes a divalent linking group, n and m independently denote an integer of 1 or greater, $R^1$ to $R^3$ independently denote a hydrogen atom, a halogen atom, or a monovalent organic substituent, at least one of $R^1$ to $R^3$ denotes a hydrolyzable group selected from the group consisting of an alkoxy group, a mercapto group, a halogen atom, an amide group, an acetoxy group, an amino group, and an isopropenoxy group, or a hydroxy group, the divalent or n-valent linking group denoted by $L^1$ to $L^3$ is a group formed from at least one type of atom selected from the group consisting of a carbon atom, a hydrogen atom, an oxygen atom, a nitrogen atom, and a sulfur atom, and the m-valent linking group denoted by $L^{s1}$ is a group formed from a sulfur atom and at least one type of atom selected from the group consisting of a carbon atom, a hydrogen atom, an oxygen atom, a nitrogen atom, and a sulfur atom.

2. The process for making a relief printing plate according to claim 1, wherein Component A above is a compound having a total of two or more hydrolyzable silyl groups and silanol groups.

3. The process for making a relief printing plate according to claim 1, wherein the hydrolyzable silyl group is a residue in which at least one of an alkoxy group and a halogen atom is directly bonded to the Si atom.

4. The process for making a relief printing plate according to claim 1, wherein Component A above is a compound further having in the molecule at least one type of group or bond selected from the group consisting of a sulfide group, an ester bond, a urethane bond, and an ether bond.

5. The process for making a relief printing plate according to claim 1, wherein Component B above is an elastomer.

6. The process for making a relief printing plate according to claim 1, wherein Component B above comprises at least one selected from the group consisting of natural rubber (NR), acrylonitrile butadiene rubber (NBR), isoprene rubber (IR), styrene butadiene rubber (SBR), butadiene rubber (BR), chloroprene rubber (CR), polystyrene-polybutadiene-polystyrene (SBS), polystyrene-polyisoprene-polystyrene (SIS), and hydrogenated products thereof.

7. The process for making a relief printing plate according to claim 1, wherein Component C above is an organic peroxide.

8. The process for making a relief printing plate according to claim 1, wherein Component C above is an organic peroxide selected from the group consisting of a dialkyl peroxide, a peroxyketal, and a peroxyester.

9. The process for making a relief printing plate according to claim 1, wherein the resin composition further comprises (Component D) a polymerizable compound.

10. The process for making a relief printing plate according to claim 1, wherein the resin composition further comprises (Component E) a fragrance.

11. The process for making a relief printing plate according to claim 1, wherein the resin composition further comprises (Component F) a photothermal conversion agent that can absorb light having a wavelength of at least 700 nm but no greater than 1,300 nm.

12. The process for making a relief printing plate according to claim 1, wherein it further comprises a rinsing step of rinsing an engraved relief layer surface with an aqueous rinsing liquid.

13. The process for making a relief printing plate according to claim 1, wherein the relief layer has a thickness of at least 0.05 mm but no greater than 10 mm.

14. The process for making a relief printing plate according to claim 1, wherein the relief layer has a Shore A hardness of at least 50° but no greater than 90°.

* * * * *